(12) United States Patent
Nebat et al.

(10) Patent No.: US 8,510,619 B2
(45) Date of Patent: Aug. 13, 2013

(54) OUTER CODING FRAMEWORK

(75) Inventors: Yoat Nebat, San Diego, CA (US); Sina Zehedi, San Diego, CA (US)

(73) Assignee: WI-LAN, Inc., Ottawa (CA)

( * ) Notice: Subject to any disclaimer, the term of this patent is extended or adjusted under 35 U.S.C. 154(b) by 0 days.

(21) Appl. No.: 13/488,014

(22) Filed: Jun. 4, 2012

(65) Prior Publication Data

US 2012/0297269 A1    Nov. 22, 2012

Related U.S. Application Data

(63) Continuation of application No. 12/202,170, filed on Aug. 29, 2008, now Pat. No. 8,195,998.

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.
   *H03M 13/00*   (2006.01)

(52) U.S. Cl.
   USPC .......................................................... 714/748

(58) Field of Classification Search
   USPC .................. 714/745–753, 758–762, 765, 774, 714/784–790, 794, 801
   See application file for complete search history.

(56) References Cited

U.S. PATENT DOCUMENTS

| 5,546,409 | A | * | 8/1996 | Karasawa ..................... 714/755 |
| 5,826,018 | A |   | 10/1998 | Vixie et al. |
| 5,983,383 | A |   | 11/1999 | Wolf |
| 6,021,433 | A |   | 2/2000 | Payne et al. |
| 6,085,253 | A |   | 7/2000 | Blackwell et al. |

(Continued)

FOREIGN PATENT DOCUMENTS

| EP | 1 718 096 | 11/2006 |
| KR | 10-1995-0010768 | 9/1995 |

(Continued)

OTHER PUBLICATIONS

Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

(Continued)

*Primary Examiner* — Nadeem Iqbal
(74) *Attorney, Agent, or Firm* — Volpe and Koenig, P.C.

(57) ABSTRACT

The subject matter disclosed herein provides an outer coding framework for minimizing the error rate of packets. In one aspect, the method may include determining, based on a cyclic redundancy check, a first erasure table including zero or more erasures; determining a second erasure table; using the first erasure table to locate errors in a frame of packets, when the zero or more erasures of the first erasure table do not exceed a threshold of erasures; and using the second erasure table to locate errors in the frame of packets, when the one or more erasures of the first erasure table do exceed the threshold of erasures. The frame may include the one or more rows encoded using the outer code. The block that is read may be provided to enable an inner code to encode the block before transmission. Related systems, apparatus, methods, and/or articles are also described.

15 Claims, 20 Drawing Sheets

(56) References Cited

U.S. PATENT DOCUMENTS

| | | | |
|---|---|---|---|
| 6,928,521 | B1 | 8/2005 | Burton et al. |
| 7,031,249 | B2 | 4/2006 | Kowalski |
| 7,058,027 | B1 | 6/2006 | Alessi et al. |
| 7,343,540 | B2 | 3/2008 | Khermosh et al. |
| 7,464,319 | B2 | 12/2008 | Budge et al. |
| 7,644,343 | B2 | 1/2010 | Gubbi et al. |
| 7,660,245 | B1 | 2/2010 | Luby |
| 7,856,026 | B1 | 12/2010 | Finan et al. |
| 7,877,663 | B2 * | 1/2011 | Vesma et al. ............ 714/758 |
| 2002/0147954 | A1 | 10/2002 | Shea |
| 2003/0081564 | A1 | 5/2003 | Chan |
| 2003/0207696 | A1 | 11/2003 | Willenegger et al. |
| 2003/0226092 | A1 | 12/2003 | Kim et al. |
| 2004/0090932 | A1 | 5/2004 | Wei et al. |
| 2004/0100937 | A1 | 5/2004 | Chen |
| 2004/0199847 | A1 | 10/2004 | Calabro et al. |
| 2004/0199850 | A1 | 10/2004 | Yi et al. |
| 2004/0243913 | A1 | 12/2004 | Budge et al. |
| 2005/0005189 | A1 | 1/2005 | Khermosh et al. |
| 2005/0088986 | A1 | 4/2005 | Sun et al. |
| 2005/0135308 | A1 | 6/2005 | Vijayan et al. |
| 2005/0265168 | A1 | 12/2005 | Kopf |
| 2006/0013168 | A1 | 1/2006 | Agrawal et al. |
| 2006/0077890 | A1 | 4/2006 | Suryavanshi et al. |
| 2006/0239264 | A1 | 10/2006 | Kang et al. |
| 2006/0239265 | A1 | 10/2006 | Son et al. |
| 2006/0248430 | A1 * | 11/2006 | Iancu et al. ............ 714/755 |
| 2007/0004437 | A1 | 1/2007 | Harada et al. |
| 2007/0019717 | A1 | 1/2007 | Laroia et al. |
| 2007/0101228 | A1 | 5/2007 | Vesma et al. |
| 2007/0165578 | A1 | 7/2007 | Yee et al. |
| 2007/0230351 | A1 | 10/2007 | Dang |
| 2007/0240027 | A1 * | 10/2007 | Vesma et al. ............ 714/759 |
| 2007/0253367 | A1 | 11/2007 | Dang et al. |
| 2007/0268933 | A1 | 11/2007 | Wu et al. |
| 2008/0022345 | A1 | 1/2008 | Kim et al. |
| 2008/0052605 | A1 * | 2/2008 | Luo et al. ............ 714/776 |
| 2008/0080474 | A1 | 4/2008 | Kitchin |
| 2008/0098283 | A1 | 4/2008 | Vayanos et al. |
| 2008/0114711 | A1 | 5/2008 | Nagaraj |
| 2008/0225819 | A1 | 9/2008 | Niu et al. |
| 2009/0034459 | A1 | 2/2009 | Shousterman et al. |
| 2009/0109890 | A1 | 4/2009 | Chow et al. |
| 2009/0150736 | A1 * | 6/2009 | Nebat et al. ............ 714/748 |
| 2009/0177940 | A1 * | 7/2009 | Guo et al. ............ 714/752 |
| 2009/0259920 | A1 * | 10/2009 | Guo et al. ............ 714/776 |
| 2010/0115379 | A1 | 5/2010 | Gubbi et al. |
| 2010/0183077 | A1 | 7/2010 | Lee et al. |
| 2011/0235724 | A1 | 9/2011 | Kim et al. |

FOREIGN PATENT DOCUMENTS

| | | |
|---|---|---|
| KR | 10-0371157 | 3/2003 |
| KR | 10-0371157 | 3/2005 |
| KR | 10-2005-0114162 | 12/2005 |
| KR | 10-2006-011864 | 10/2006 |
| KR | 10-2006-0064677 | 6/2007 |
| KR | 10-2007-0068456 | 6/2007 |
| WO | 2005/022814 | 3/2005 |

OTHER PUBLICATIONS

Agashe et al., "CDMA2000 High Rate Broadcast Packet Data Air Interface Design," IEEE Comm. Magazine, pp. 83-89 (Feb. 2004).

Form PCT/ISA/220, Notification of Transmittal of the International Search Report and the Written Opinion of the International Searching Authority, or the Declaration, mailed May 18, 2009.

Form PCT/ISA/220, Notification of Transmittal of the International Search Report and the Written Opinion of the International Searching Authority, or the Declaration, mailed Apr. 30, 2009.

Form PCT/ISA/220, Notification of Transmittal of the International Search Report and the Written Opinion of the International Searching Authority, or the Declaration, mailed Apr. 20, 2009.

Form PCT/ISA/220, Notification of Transmittal of the International Search Report and the Written Opinion of the International Searching Authority, or the Declaration, mailed May 26, 2009.

Form PCT/ISA/220, Notification of Transmittal of the International Search Report and the Written Opinion of the International Searching Authority, or the Declaration, mailed Jun. 24, 2009 for corresponding PCT Application PCT/US2008/086103.

Form PCT/ISA/220, Notification of Transmittal of the International Search Report and the Written Opinion of the International Searching Authority, or the Declaration, mailed May 26, 2009 for corresponding PCT Application PCT/US2008/086278.

IEEE 802.16 Broadband Wireless Access Working Group, IEEE 802.16pc-00/33, "FEC Performance of Concatenated Reed Solomon and Convolutional Coding with Interleaving," (Jun. 8, 2000).

IEEE 802.16 Broadband Wireless Access Working Group, IEEE 802.16maint-08/293, "Optional outer-coded data mode for MBS," (Sep. 11, 2008).

Jenkac et al., "Flexible outer Reed-Solomon coding on RLC layer for MBMS over GERAN," Vehicular Technology Conference. vol. 5, pp. 2777-2781 (May 2004).

Patent Cooperation Treaty (PCT) International Search Report, PCT/US2008/085984, Notification of Transmittal of the International Search Report and the Written Opinion of the International Authority, or the Declaration, mail date Mar. 27, 2009, 11 pages.

Pursley et al., "Variable-Rate Coding for Meteor-Burst Communications," IEEE Trans. On Comm., vol. 37, No. 11 (Nov. 1989).

Qualcomm, "MBMS design consideration," 3GPP TSG WGIT, R1-02-1099 (Jan. 7-10, 2003).

Wang et al., "System Architecture and Cross-Layer Optimization of Video Broadcast over WiMAX," IEEE Journal on Selected Areas in Communications, vol. 25, No. 4 pp. 712-721 (May 2007).

Wei et al., "Application of NB/WB AMR Speech Codes in the 30-kHz TDMA System," IEEE Trans. On Comm., vol. 6, No. 6 (Nov. 2004).

* cited by examiner

FIG. 14A

705C FIRST ERASURE TABLE 1490

FIG. 14C

SECOND ERASURE TABLE 1495
705L
705C

OUTER CODING FRAMEWORK

CROSS REFERENCE TO RELATED APPLICATIONS

This application is a continuation of U.S. patent application Ser. No. 12/202,170, filed Aug. 29, 2008, which will issue as U.S. Pat. No. 8,195,998 on Jun. 5, 2012, which claims the benefit of U.S. Provisional Application No. 61/007,360, filed Dec. 11, 2007, U.S. Provisional Application No. 61/019,572, filed Jan. 7, 2008, U.S. Provisional Application No. 61/024,507, filed Jan. 29, 2008, and U.S. Provisional Application No. 61/060,117, filed Jun. 9, 2008, all of which are incorporated by reference as if fully set forth.

TECHNICAL FIELD

The subject matter described herein relates to wireless communications and, more particularly, error-correction coding.

BACKGROUND

Channel coding, such as forward error-correction coding or error-correction coding, introduces redundancy into a signal prior to transmission or storage of the signal. The redundancy enables a receiving system to detect and, perhaps, correct errors introduced into the signal by, for example, the channel, receiver, transmitter, storage medium, and the like. For example, in a communication system that employs forward error-correction coding, a source provides data to an encoder (also referred to as a coder). The encoder inserts redundant (also sometimes referred to as parity) bits, thereby outputting a longer sequence of code bits, called a codeword. The codewords can then be transmitted to a receiver, which uses a suitable decoder to extract the original, unencoded data and correct errors caused by, for example, the channel and/or the receiver.

Channel coding can thus be used to detect and/or correct errors—reducing the need for the source transmitter to retransmit data received in error. By reducing the need to retransmit data that is in error, the throughput of the channel or link is improved. Moreover, the correction of errors also improves the quality of the data received at the receiver. In the case of a digital video broadcast, error-correction coding enhances not only the quality of the digital video broadcast over the wireless channel but also improves the throughput of the wireless channel.

SUMMARY

The subject matter disclosed herein provides methods and apparatus for an outer coding framework for minimizing the error rate of data, such as packets used to transmit a digital video broadcast as well as other forms of data.

In one aspect, there is provided a method. The method may include determining, based on a cyclic redundancy check, a first erasure table including zero or more erasures; determining a second erasure table; using the first erasure table to locate errors in a codeword, when the zero or more erasures corresponding to the codeword in the first erasure table do not exceed a threshold of erasures; and using the second erasure table to locate errors in the codeword, when the zero or more erasures corresponding to the codeword in the first erasure table do exceed the threshold of erasures. The frame may include the one or more rows encoded using the outer code. The block that is read may be provided to enable an inner code to encode the block before transmission.

In another aspect, there is provided a method. The method may include receiving link-layer packets, a first portion of the received link-layer packets appended with a cyclic redundancy check and a second portion of the received link-layer packets not appended with a cyclic redundancy check; inserting the received link-layer packets into one or more columns of a frame, the first portion of the received link-layer packets having the appended cyclic redundancy check removed before insertion into the frame; decoding, using an outer code, one or more rows of the frame; and reading the one or more rows of the frame, when the one or more rows are decoded using the outer code, the one or more rows of the frame forming an application data packet.

In another aspect there is provided a method. The method may include receiving application data packets, each appended with a cyclic redundancy check, the application data packets included in a frame and decoded using an outer code; reading at least one application data packet from the frame; and discarding, at least one of the read application data packets, when the cyclic redundancy check appended to the at least one read application data packet indicates an error.

In another aspect there is provided a method. The method may include inserting link-layer packets into a frame, the frame configured to include a data portion and a parity portion, and the parity portion configured to substantially maintain a quantity of frame errors; decoding, using an outer code, the frame, when the columns of the frame have been filled; and reading, from the frame, application data packets.

Variations of the above aspects may include one or more of the following features. Using at least one of a receive failure and a signal-to-noise ratio to determine the second erasure table. The frame may be implemented as a Reed-Solomon table. Erasures may be counted, and decoding may occur when additional information is included in at least one of the first erasure table and the second erasure table. Packets appended with a cyclic redundancy check may be received. The cyclic redundancy check may be used to determine erasures for the first erasure table. Received packets may be inserted into one or more columns of the frame. One or more portions of the frame may be decoded using an outer code. A portion of the frame may be read, when the decoding using the outer code has taken place. The read portion may be inserted into an application data table. Moreover, the first portion of packets may be received as a first substream of packets, and the second portion of packets may be received as a second substream of packets. The first substream of packets having a higher priority than the second substream of packets. The received link-layer packets may be inserted into the one or more frames each configured as a Reed-Solomon table. The received link-layer packets may be decoded using an inner code. A hybrid automatic retransmission request (HARQ) protocol data units may be received as the first portion of the received link-layer packets appended with the cyclic redundancy check. Packets may be discarded by not providing the application data packet in error to another component at the client station. Moreover, a read application data packet may be used, when the cyclic redundancy check appended to the read application data packet indicates that the read application data packet is not in error. Moreover, the frame error may be an error in a codeword of the frame. Furthermore, the frame may be configured to have a fixed quantity of columns. The quantity of frame errors may be maintained by varying, in another frame, a fraction of columns of the corresponding parity portion. The quantity of frame errors may be maintained by increasing, in another frame, a fraction of columns of the corresponding parity portion. The frame may be in a first time interval and the other frame may be in a second time interval.

Moreover, one or more of the above note aspects and features may be embodied as a computer-readable medium (e.g., a computer-readable medium containing instructions to configure a processor to perform a method noted herein). In addition, one or more of the above note aspects and features may be embodied as a system (e.g., a system comprising at least one processor and at least one memory, wherein the at least one processor and the at least one memory are configured to provide a method noted herein).

The details of one or more variations of the subject matter described herein are set forth in the accompanying drawings and the description below. Features and advantages of the subject matter described herein will be apparent from the description and drawings, and from the claims.

DESCRIPTION OF DRAWINGS

In the drawings,

Figure 14C:
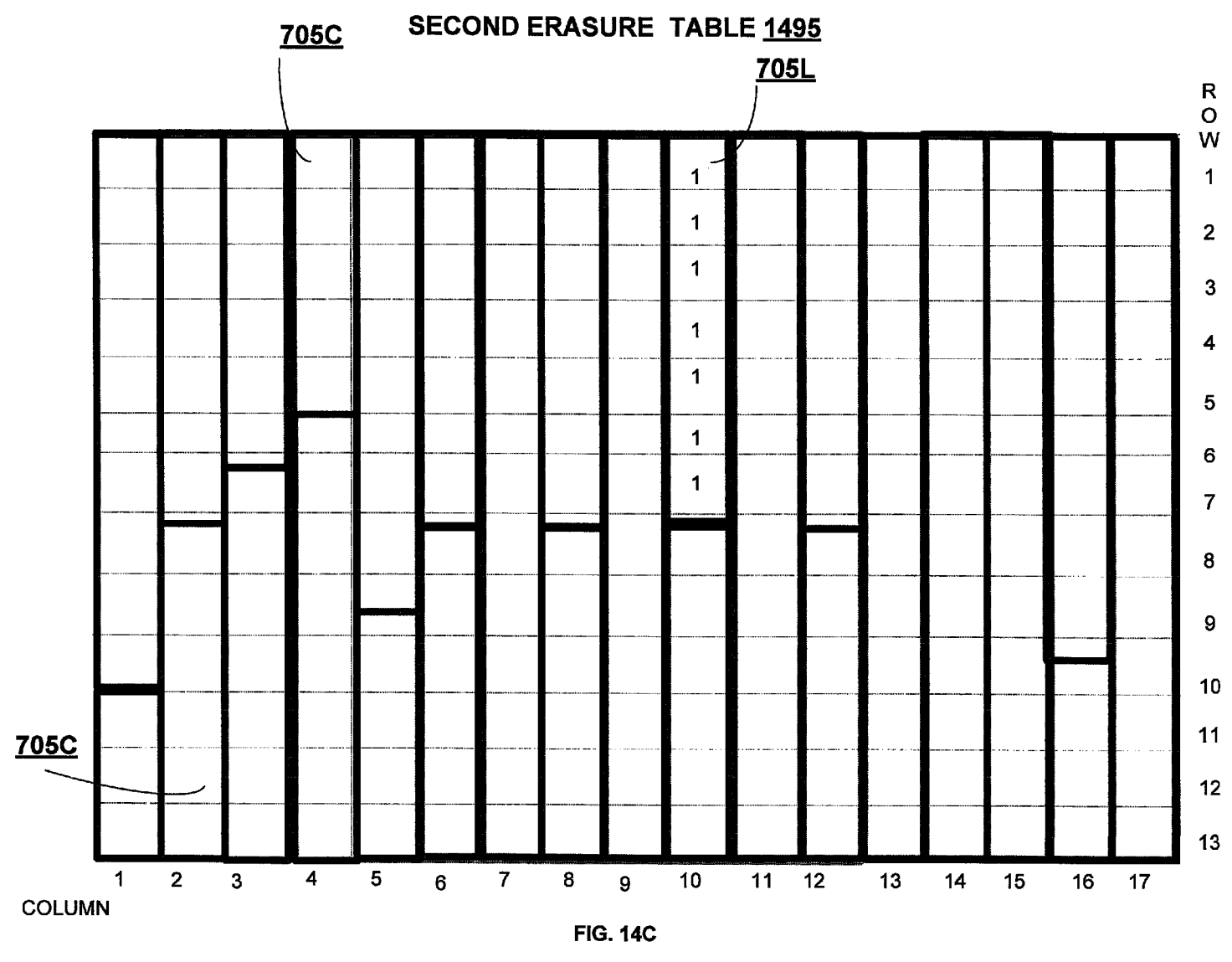

FIG. 14A depicts an example of an erasure table;

FIG. 14C depicts another example of an erasure table; and

Figure 1:
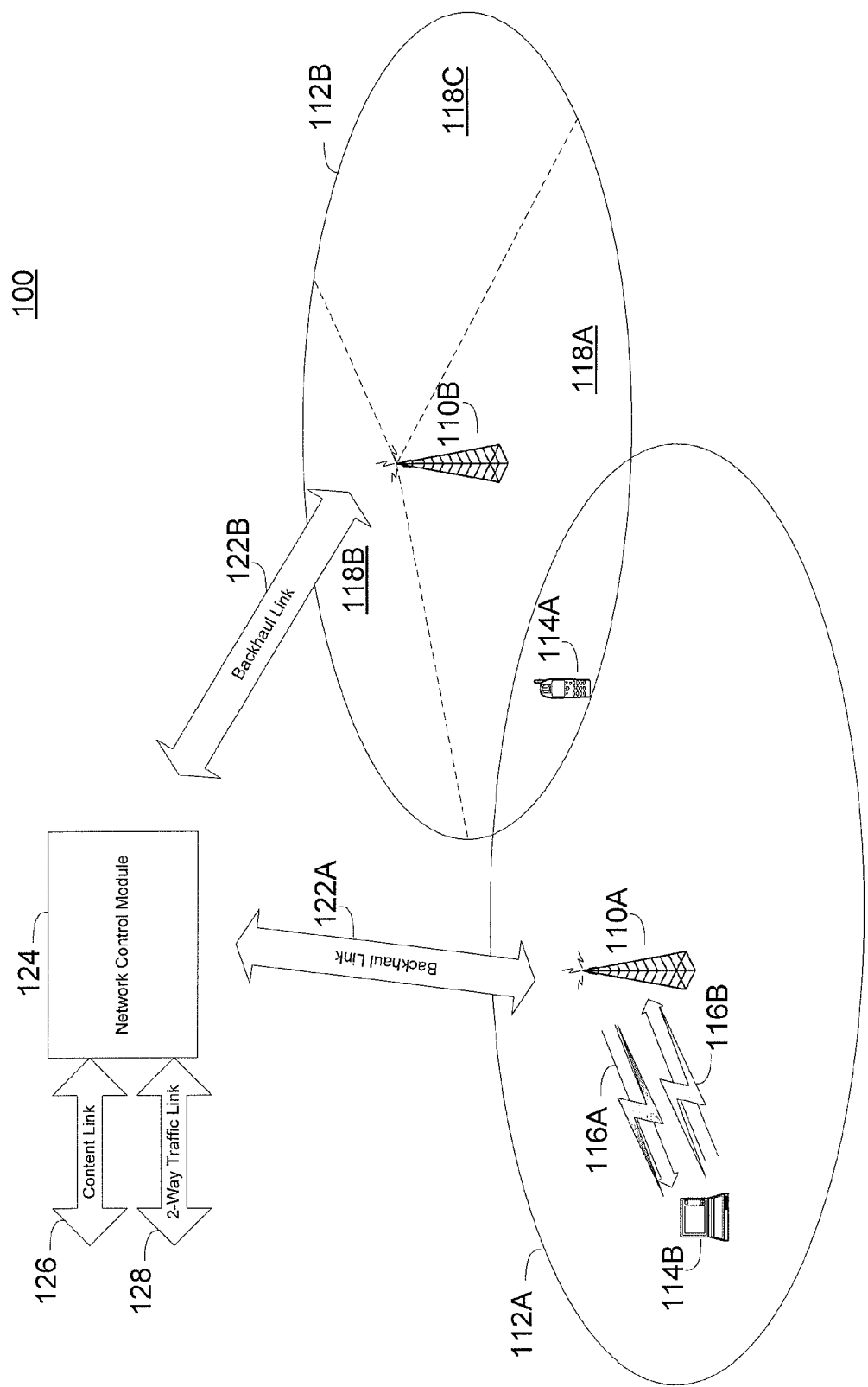
FIG. 1 depicts a block diagram of a network including client stations and base stations.

Like labels are used to refer to same or similar items in the drawings.

DETAILED DESCRIPTION OF THE PREFERRED EMBODIMENTS

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118A-C as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter reading equipment or the like and may include a display mechanism, microphone, speaker and memory.

In a typical system, the base stations 110A and 110B also communicate with each other and a network control module 124 over backhaul links 122A and 122B. The backhaul links 122A and 122B may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications.

The description in the context of an OFDMA system is offered for the purposes of providing a particular example only.

As used herein, IEEE 802.16 refers to one or more Institute of Electrical and Electronic Engineers (IEEE) Standard for Local and metropolitan area networks, Part 16: Air Interface for Fixed Broadband Wireless Access Systems, 1 Oct. 2004, IEEE Standard for Local and metropolitan area networks, Part 16: Air Interface for Fixed and Mobile Broadband Wireless Access Systems, 26 Feb. 2006, and any subsequent additions or revisions to the IEEE 802.16 series of standards.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as tones). The subcarriers are modulated using BPSK (binary phase shift keying), QPSK (quadrature phase shift keying), QAM (quadrature amplitude modulation), and carry symbols (also referred to as OFDMA symbols) including data coded using a forward error-correction code.

Figure 2:
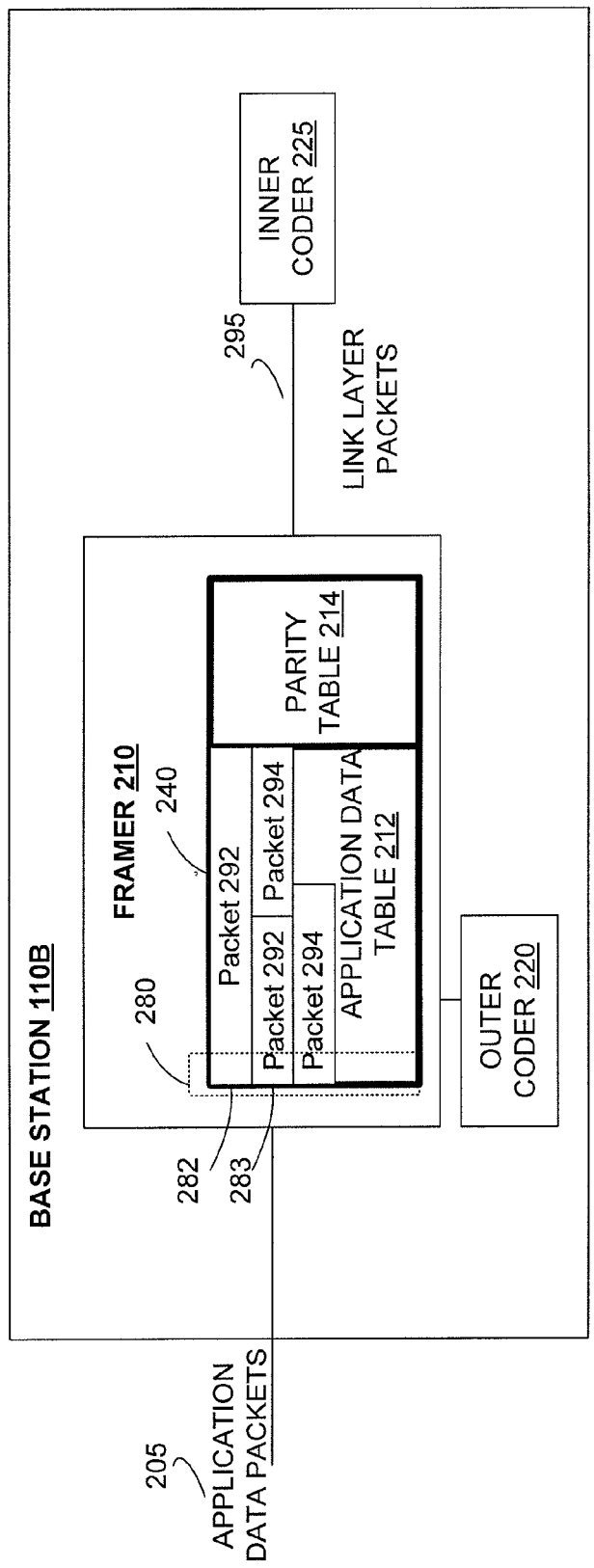
FIG. 2 depicts a block diagram of a base station using outer coding on application data packets.

FIG. 2 depicts an implementation of base station 110B. Base station 110B includes a framer 210 for arranging data into a frame 240, an outer coder 220 for providing an outer coding on the data in the frame 240, and an inner coder 225 for further encoding data that has been encoded by the outer coder 220. The frame 240 further includes an application data table 212 and a parity table 214. The "data" values in frame 240 may be data, such as application data packets (e.g., data packets 292 and 294), or may be references to memory locations where the data can be accessed in memory. In some embodiments, the components of base station 110B may be distributed in one or more locations. For example, the framer 210 and outer coder 220 are implemented at a control module, such as network control module 124, a base station controller, or the like, while inner coder 225 is implemented at each of base stations 110A and 110B. In this example, frame 240 may be sent to each of base stations 110A and 110B, and each of the base stations may encode blocks read from the columns of frame 240 before those encoded blocks are sent to a client station or other device, such as a storage device. Moreover, in some implementations, inner coder 225 is disabled or not included, such that the outer coder 220 is the primary or sole forward error-correction mechanism. It should be noted that FIG. 2 also illustrates frame 240 including column 280 and rows 282 and 283, described further below with respect to FIG. 3.

Figure 3:
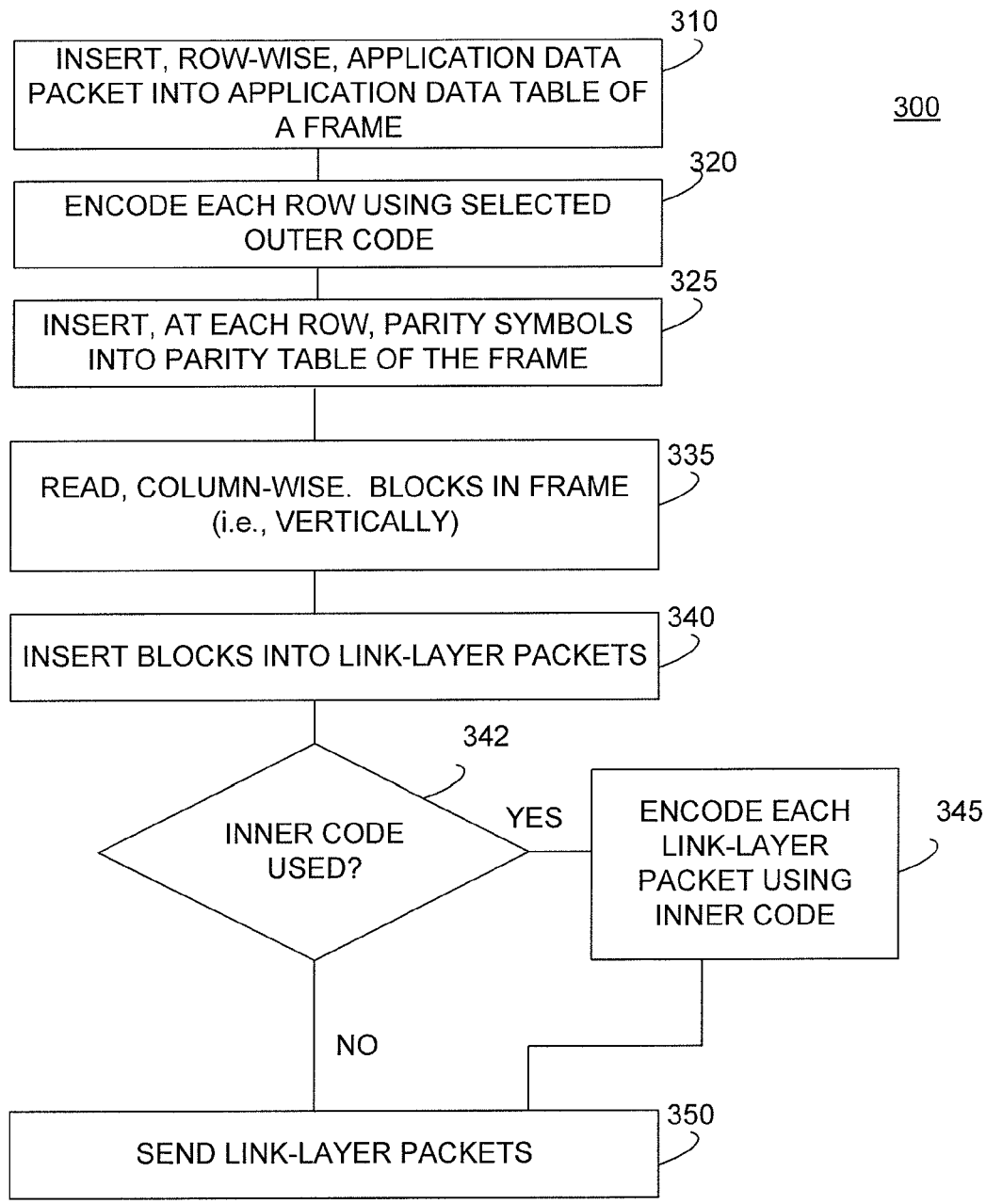
FIG. 3 depicts a process for using outer coding on application data packets received at a base station.

FIG. 3 depicts a process 300 for using an outer code to encode data received at a base station, such as base station 110B. The description of FIG. 3 below will also refer to base station 110B depicted at FIGS. 1 and 2.

At 310, base station 110B may insert row-wise (i.e., along the rows of a frame, table, or data structure) one or more application data packets 205 into an application data table 212 of frame 240. The application data packets 205 may be received from content link 126, two-way traffic link 128, a base station, or any other component of network 100. The application data packets 205 may include broadcast data, such as a digital video broadcast, although any other data may be included in application data packets.

Furthermore, frame 240 may be stored in a storage medium such as, for example volatile or non-volatile storage mediums. Exemplary volatile storage mediums include random access memory (RAM), such as dynamic RAM (DRAM), static RAM (RAM), and the like. Exemplary non-volatile storage mediums may include magnetic RAM (MRAM), battery backed RAM, and the like. Moreover, the memory provided by the storage medium is typically addressed by rows and columns, such that a memory location can be identified by its row and column. For example, framer 210 may write to and read from frame 240 using the row and column addresses of frame 240 and those read-write operations may result in an access to a corresponding location in memory (e.g., the location in memory being addressed as a row and column in memory using a virtual address or a physical address in memory).

To insert the received application data packets 205 into application data table 212, framer 210 may insert each received packet row-wise by inserting the received packets sequentially into the rows of the frame 240 (e.g., filling the first row, then the second row, and so forth). In the example of FIG. 2, framer 210 inserts a first packet 292 into the first row and, when that first row is filled, a portion of the second row. Framer 210 also inserts a second packet 294 into the second row and a portion of the third row. Additional application data packets may also be inserted into the remaining rows of application data table 212 until the rows of application data table 212 have been filled and/or until there are no application data packets 205 to send to a client station, such as client station 114A. In some implementations, the insertion of application data packets 205 may also include fill data, which is also referred to as pad packets. Moreover, in the context of the frame 240, the term "fill" refers to putting as many packets as can be held or conveniently contained, but not necessarily filling, the frame to capacity (e.g., a frame can be considered filled when only ½ of the frame is occupied with packets).

At 320, outer coder 220 encodes each row of application data table 212 using an outer code. In some implementations, outer coder 220 encodes each row of frame 240 as that row is filled, while in other cases, outer coder 240 encodes each row of frame 240 when application data table 240 is filled. In some implementations, outer coder 220 is implemented as a forward error-correction coder, such as a Reed-Solomon forward error-correction coder or a low-density parity check (LDPC) coder, although other error-correction or forward error-corrections coders may be used as well.

At 325, as each row is encoded using an outer code, outer coder 220 inserts into parity table 214 any parity symbols generated by the outer code. For example, when a Reed-Solomon (RS) (255,243) coder is used, as described further below, each row of frame 240 would include parity symbols having a length of 12, which would be inserted into parity table 214 by outer coder 220.

In some implementations, a Reed-Solomon forward error-correction coder is the outer coder 220. When that is the case, the frame 240 is referred to as an RS table and each row of frame 240 is an RS codeword. For example, the outer coder 220 may use an RS (255,243) code as the outer code. The RS (255,243) code corresponds to a code that takes as an input 243 bytes and outputs a resulting codeword of 255 bytes. Because a Reed-Solomon code is a systematic code, the first 243 positions of the row (which fall in the application data table 212) will be left unchanged and the next 12 columns of the row (which fall in parity table 214) will include the computed parity bytes. The RS (255,243) would thus result in application data table 212 having 243 bytes per row and parity table 214 having 12 parity bytes per row. For example, when outer coder 220 uses an RS (255,243) code, the outer coder 220 would encode 243 bytes in the first row of application data table 212 and generate the 12 bytes of parity, such that the RS codeword for the first row is 255 bytes, i.e., 243+12. In this example, outer coder 220 would continue to use the RS (255, 243) code to encode any remaining rows in frame 240. Although Reed-Solomon is described herein as the outer code, other codes (as well as codes of other sizes) may be used as well including codes that are not systematic, i.e., resulting in a codeword that does not necessarily include a portion that is identical to the original input. Moreover, in some implementations, the Reed-Solomon code may be an RS (255, Y) code, where Y is an odd number between 191 and 253. Although the above example relates to a specific number of rows and columns, frame 240 may be implemented to have any number of rows and columns.

At 335, framer 210 reads blocks of data (or simply "blocks"), wherein the reading is done column-wise, i.e., reading one or more values from the columns of frame 240. For example, framer 240 may read, column-wise, a first block from the first column by reading a first value at row one 282 of the first column 280, then reading another value at the second row 283 of the first column 280, and so forth sequentially down first column 280. In some cases, framer 240 may read an entire column, such as column 280, to form a block, while in other cases, the framer 240 may read a portion of one or more columns to form the block. The processing at 310-335 of frame 240 thus provides an interleaving of the packets inserted at 310.

At 340, framer 340 inserts the blocks read at 335 into packets, such as link-layer packets, although other types of packets and structures of data may be used as well. For example, framer 240 may read a portion of first column 280 to form a link-layer packet having 120 bytes, although other packet sizes may be used as well. The phrase "link-layer packets" refers to a type of packet that may be exchanged between a base station and a client station. For example, in some embodiments, the link-layer packet may be a protocol data unit (PDU) that includes a header in the front and a cyclic redundancy check (CRC) appended to the end of the data, such as a hybrid automatic retransmission request (HARQ) PDU in conformance with the IEEE 802.16 standard, or the link-layer packet may be a PDU that does not include a header and/or an appended CRC.

In some implementations, an inner code is also used to further encode the block or link-layer packet read from frame 240 (yes at 342), while in other cases the inner code is not used (no at 342). When the inner code is used at 345, inner coder 225 uses an inner code to encode each of the link-layer packets. The inner coder 225 may encode the link-layer packets using one or more error-correction or forward error-correction coding schemes, such as a Convolution Code (CC), a Convolutional Turbo Code (CTC), and the like. Although 345 is described above as applying an inner code to link-layer packets, the inner coder 225 may also apply the inner code to the blocks read at 335 (e.g., before the blocks are inserted into the link-layer packets).

At 350, the base station 110B sends the link-layer packets to a client station, such as client station 114A. When the inner code is not applied to the link-layer packets, base station 110B sends those packets through the wireless network to client station 114A, relying on the outer code to provide forward error-correction. When the inner code is applied, base station 110B sends through the wireless network to client station 114A the link-layer packets encoded with an outer code concatenated with an inner code. Base station 110B may include other components, such as a radio frequency (RF) front-end comprising an antenna to transmit an RF signal, such as a downlink to client station 114A. The RF front-end may also include other components, such as filters, converters (e.g., digital-to-analog converters and the like), an Inverse Fast Fourier Transform (IFFT) module, and symbol mappers. These and other components may be used to modulate data, such as the link-layer packets, onto the RF signal transmitted by base station 110B. In some implementations, the base station 110B is compatible with IEEE 802.16 and transmits an RF signal configured as an OFDMA signal, including subcarriers carrying the link-layer packets.

Although process 300 is described in connection with a base station sending packets to a client station, process 300 may be used in other applications. For example, process 300 may be used to provide an outer code on data sent to a storage device, such as a hard drive or optical storage device.

Figure 4A:
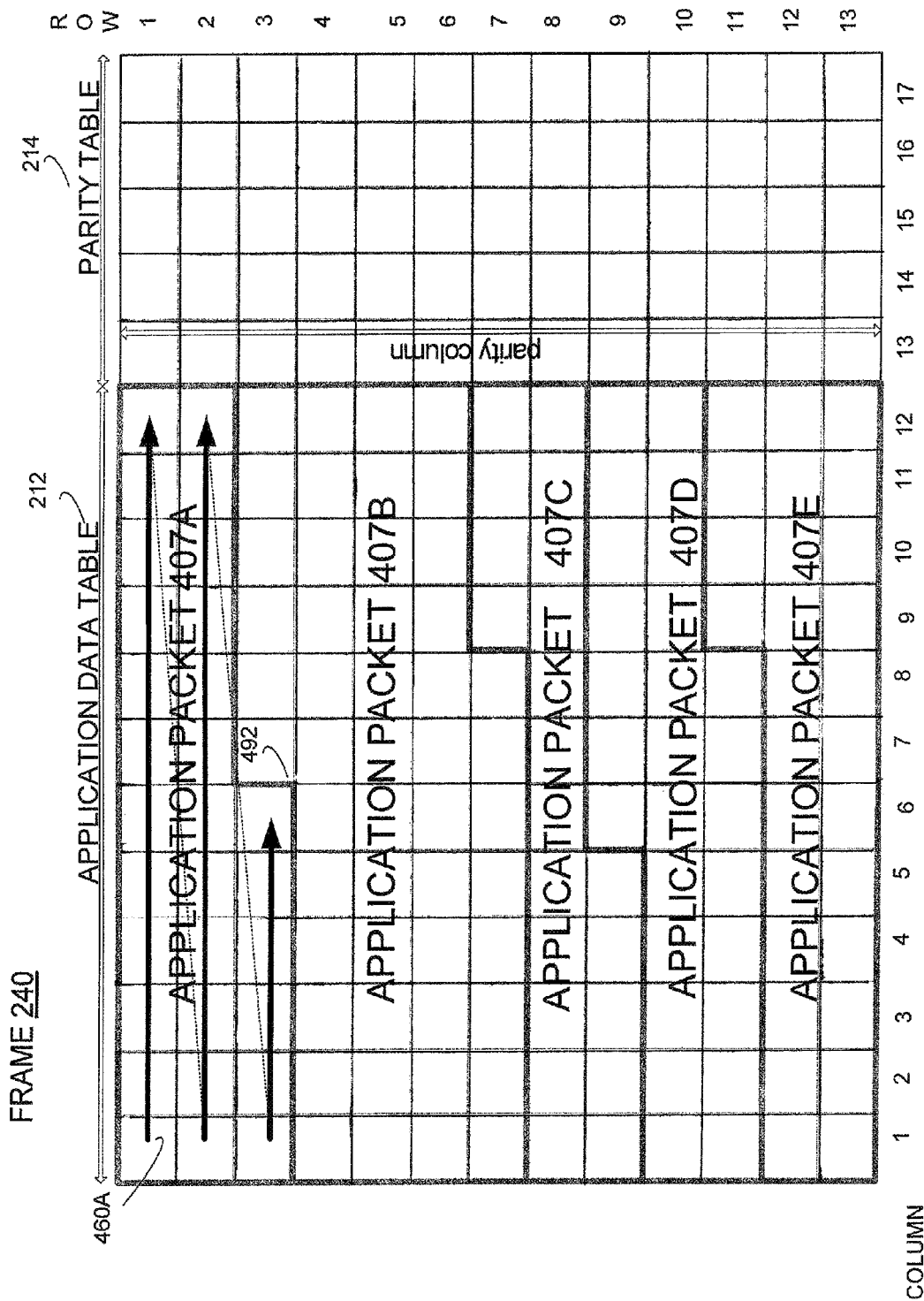
FIGS. 4A, 4B, 4C, 5, and 6 depict examples of frames at various stages during the process of outer coding at the base station.
Figure 4B:
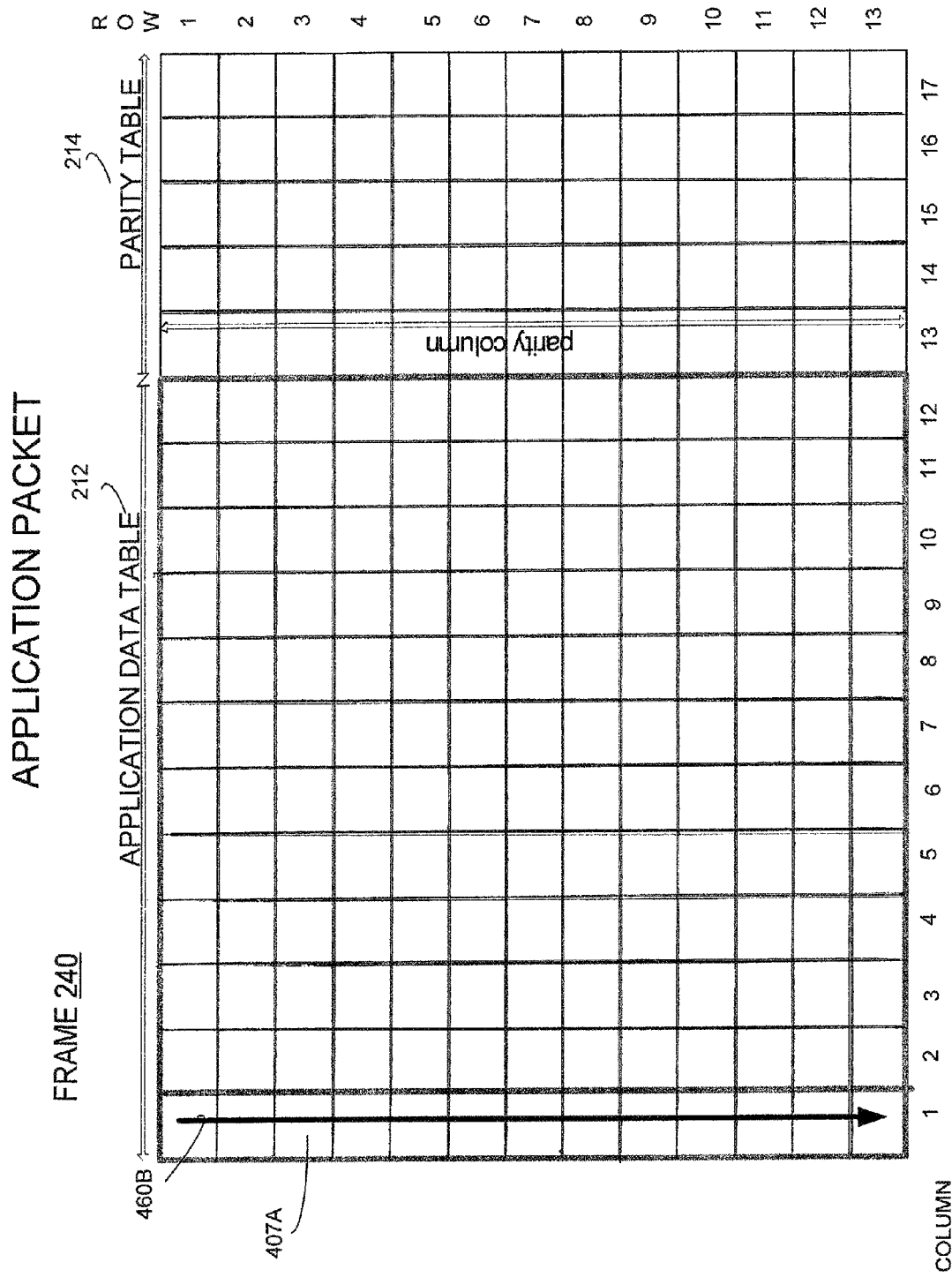

FIGS. 4A, 4B, 4C, 5, and 6 depict frame 240 at various stages of process 300. Referring to FIG. 4A, application data packets 407A-E are inserted row-wise into application data table 212. In the example of FIG. 4A, the first application data packet 407A fills three rows. The framer 210 inserts application data packet 407A row-wise across the rows as depicted at pattern 460A, which shows the pattern for how each bit of the packet is written into the rows, although other row-wise writing patterns may be used as well. Framer 210 inserts a second, subsequent application data packet 407B into the remaining portion of the third row and filling the remainder of the third row as well as rows four through six and a portion of row seven. Framer 210 continues to insert application data packets 407C-E row-wise across application data table 212. Although FIG. 4A depicts a row-by-row insertion of packets 407A-E, other patterns of packet insertion may be used as well. For example, FIG. 4B depicts a column-by-column pattern 460B. The framer 210 inserts application data packets in columns as depicted at pattern 460B, which shows how each byte of the first application data packet 407A is inserted into the columns. Although FIG. 4B depicts first application data packet 407A occupying the entire first column, first application data packet 407A may occupy only a portion of the first column or a plurality of columns. Additional application data packets, such as application data packets 407B-E, are also inserted into the columns of frame 240 (and, in particular, application data table 212).

Figure 4C:
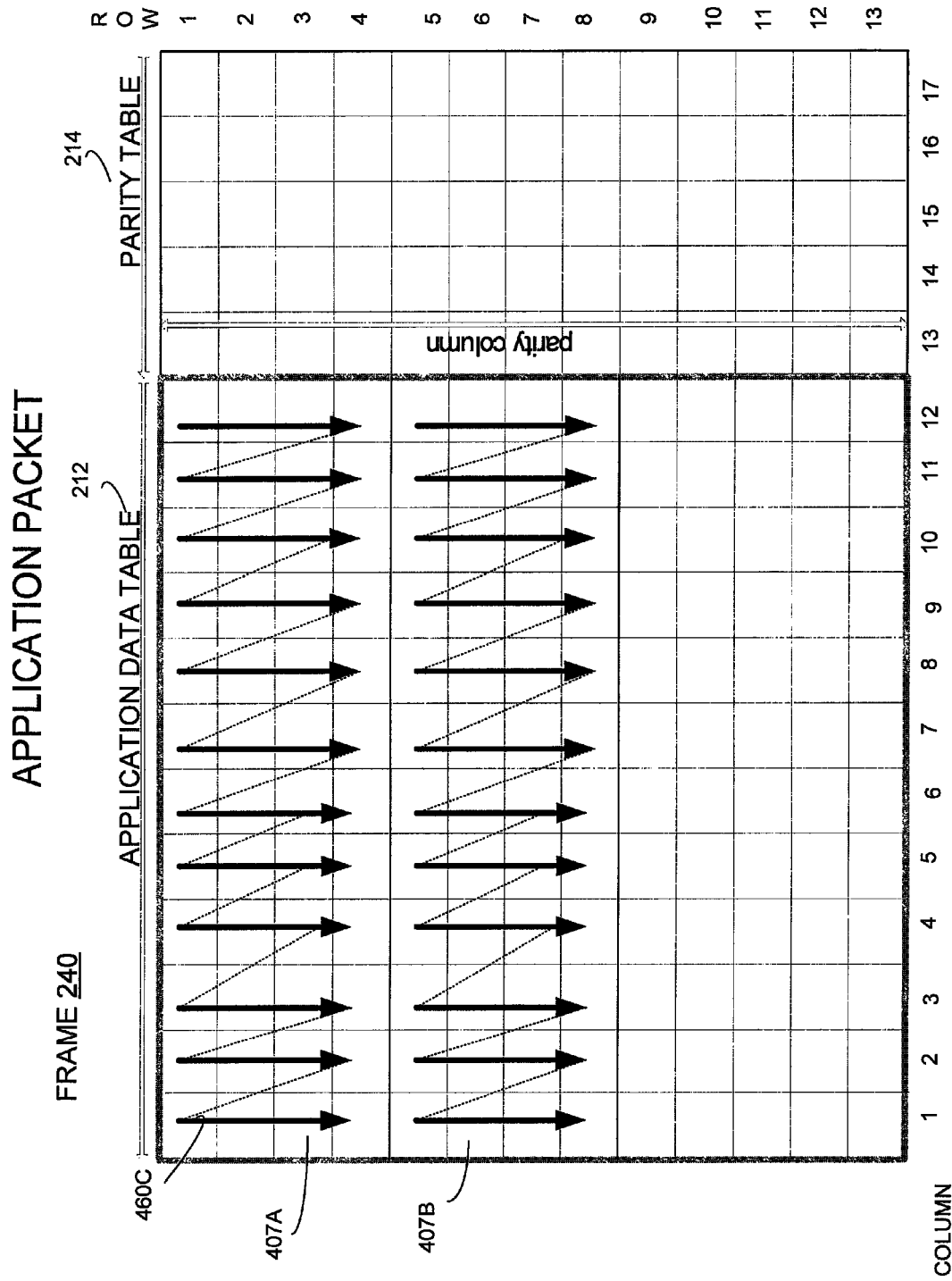

FIG. 4C depicts another pattern 460C. Referring to FIG. 4C, the framer 210 inserts first four bytes of first packet 407A into the first column, the next four bytes of first packet 407A into the second column, and so forth. This so-called "block" pattern 460C can be used with other, subsequent application data packets to fill frame 240. For example, application data packet 407B may be inserted into frame 240 using the pattern 460C, as depicted at FIG. 4C. Although pattern 460C depicts a block of 12 columns and 4 rows, other block sizes may be used as well. Additional application data packets, such as application data packets 407B-E, are also inserted into the blocks of frame 240 (and, in particular, application data table 212).

Figure 5:
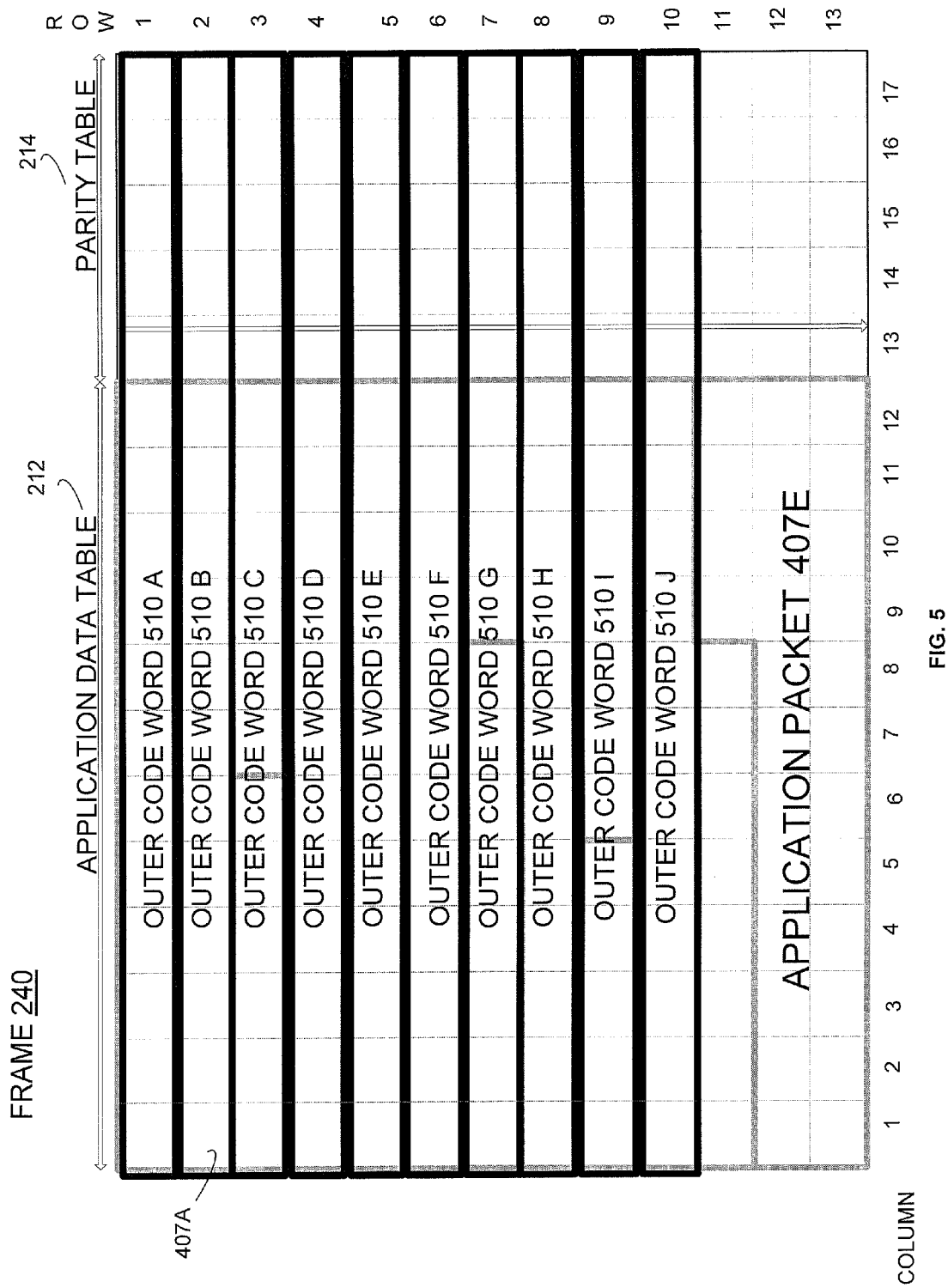

FIG. 5 depicts the frame 240 after the outer coder 220 uses the outer code to encode the first ten rows of frame 240, as described above with respect to FIG. 3 at 320. The first ten rows are depicted as outer codewords 510A-J. The first row is encoded using an outer code, such as an RS code, to form an outer coder word 510A, which includes parity symbols corresponding to the columns of parity table 214. The second row is also encoded using an outer code, such as an RS code, to form an outer coder word 510B, which includes parity symbols corresponding to the columns of parity table 214.

Figure 6:
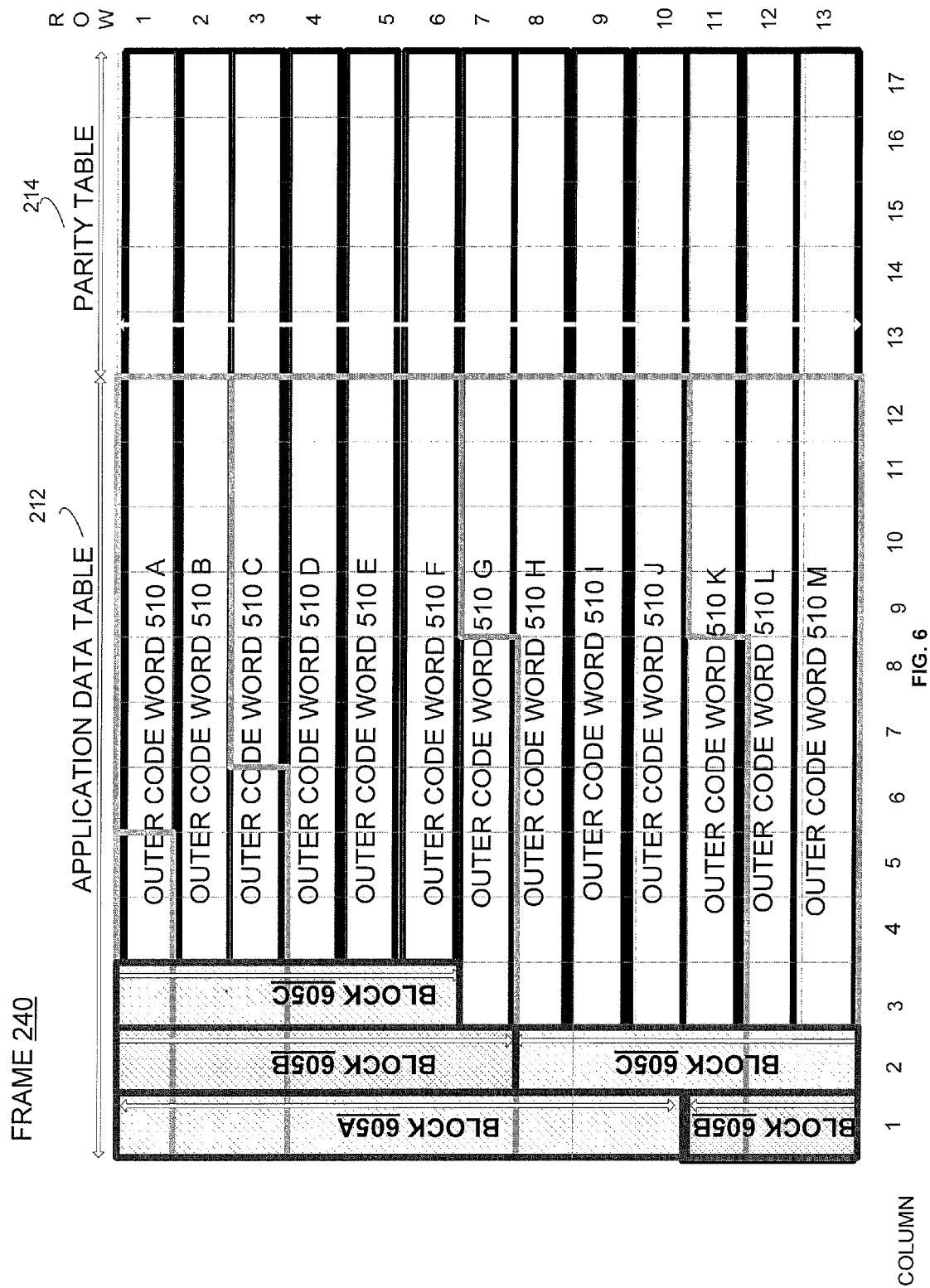

FIG. 6 depicts frame 240 after outer coder 220 has encoded the rows of frame 240 to form outer codewords 510A-M, which includes the parity symbols inserted into parity table 214. FIG. 6 also depicts how blocks may be read column-wise from frame 240. For example, framer 210 reads block 605A from a portion of the first column. Next, framer 210 reads block 605B from the remaining portion of the first column and a portion of the second column, and then reads block 605C from the remaining portion of the second column and a portion of the third column and so forth until all the columns of frame 240 are read. The blocks that are read may then be packaged into link-layer packets and provided to, for example, inner decoder 225, so that the block can be encoded using an inner code. Or, for example, the blocks may be first provided to the inner decoder 225 prior to being packaged in link-layer packets.

Figure 7:
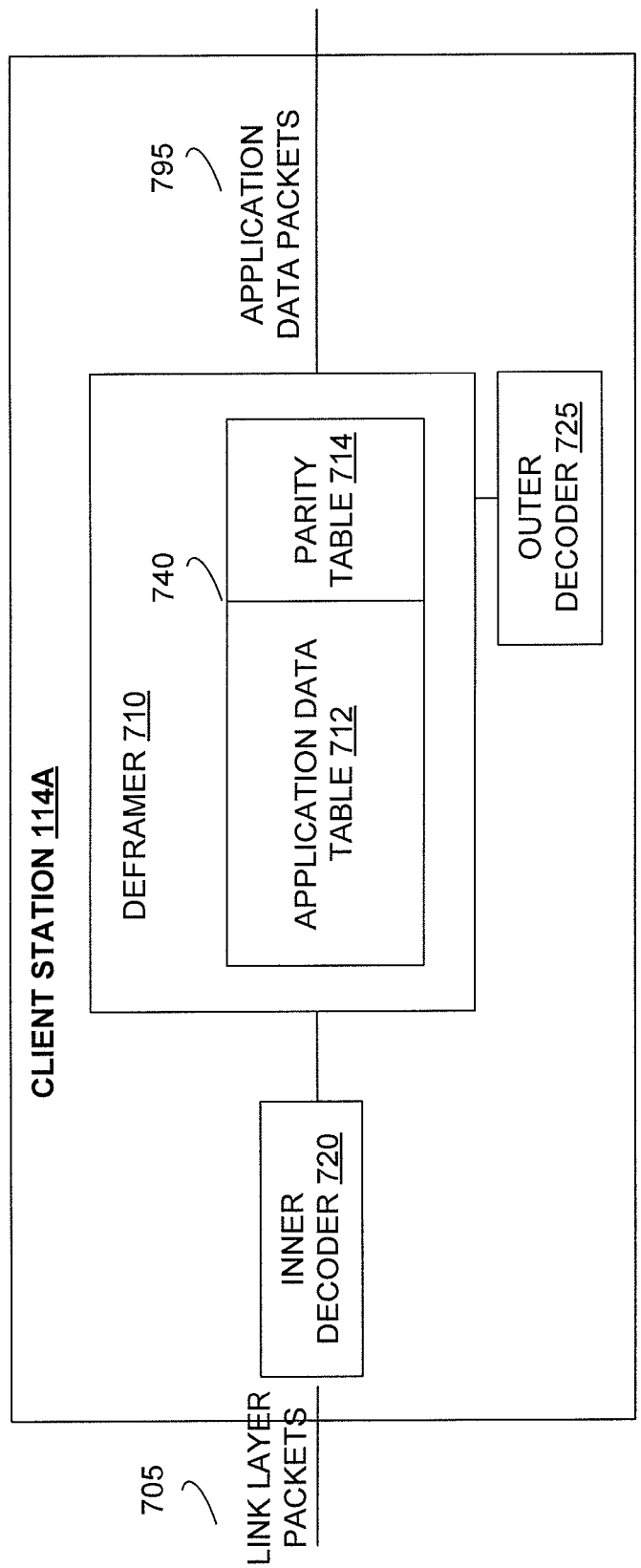
FIG. 7 depicts a block diagram of a client station using outer coding on application data packets.

FIG. 7 depicts a client station 114A. Client station 114A includes an inner decoder 720 for decoding received packets using an inner code, a deframer 710 for arranging data into a frame 740, and an outer decoder 725 for decoding using an outer code. The frame 740 includes an application data table 712 and a parity table 714.

Figure 8:
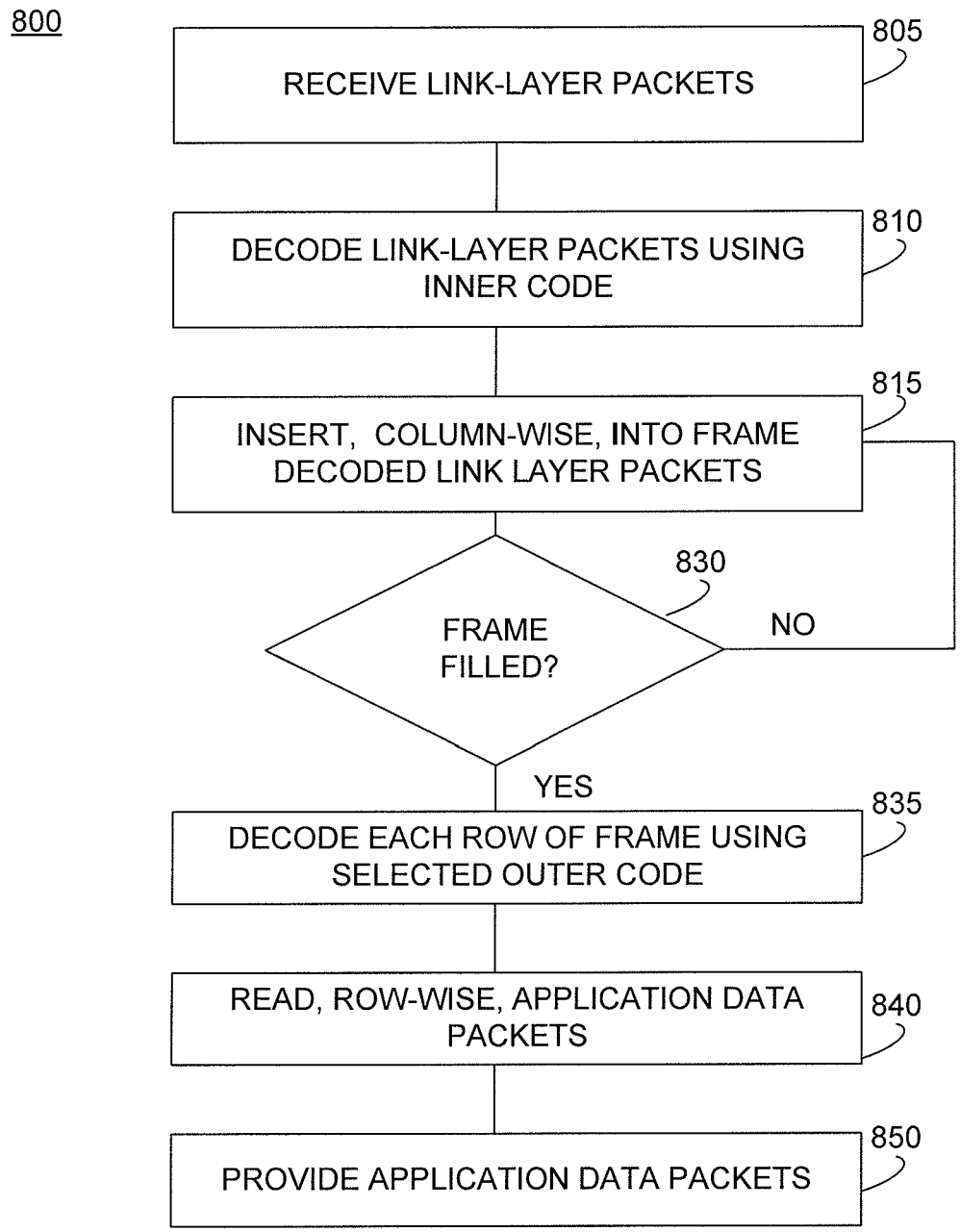
FIG. 8 depicts a process for using outer code decoding on application data packets received at a client station.

FIG. 8 depicts a process 800 for decoding packets, such as link-layer packets 705 received from a wireless network and base station 110B.

At 805, client station 114A receives one or more link-layer packets 705 from a wireless network and base station 110B. Client station 114A may include a radio frequency (RF) front-end comprising an antenna to receive an RF signal, such as a downlink from base station 110B. The RF front-end may also include other components, such as filters, analog-to-digital converters, a Fast Fourier Transform (FFT) module, and a symbol demapper. These and other components may be used to demodulate the RF signal into data and, in particular, the link-layer packets transmitted by base station 110B and carried by the RF signal. In some implementations, the client station 114A is compatible with IEEE 802.16 and receives an RF signal configured as an OFDMA signal, including subcarriers carrying the link-layer packets.

At 810, the inner decoder 720 decodes, using an inner code, the one or more link-layer packets 705. The inner-code may be implemented as any error-correction or forward error-correction code, such as a Convolutional Turbo Code (CTC), a Convolutional Code (CC), or any other code. For example, inner decoder 720 may be implemented as CTC decoder, the output of which may be provided to deframer 710 for insertion into frame 740 as described below at 815. Moreover, as noted above, in some implementations, the inner code is either disabled or not used, such that decoding by the inner decoder 720 is not necessary. Further, an optional CRC may be appended (as described further below) to the link-layer packets prior to encoding the link-layer packet using an inner code, in implementations employing an inner code.

At 815, client station 114A and, in particular, deframer 710 inserts into frame 740 one or more link-layer packets 705 (or blocks of decoded packets), decoded by inner decoder 720. When the data block that is read in 335 (FIG. 3) is augmented with a header and/or a CRC (e.g., which is the case in a HARQ PDU consistent with IEEE 802.16) before transmission, that header and/or CRC may be removed from the link-layer packets before those packets are inserted column-wise into frame 740. In some implementations, the inner code is not used; nonetheless, link-layer packets 705 are inserted into the frame 240 column-wise.

Figure 9:
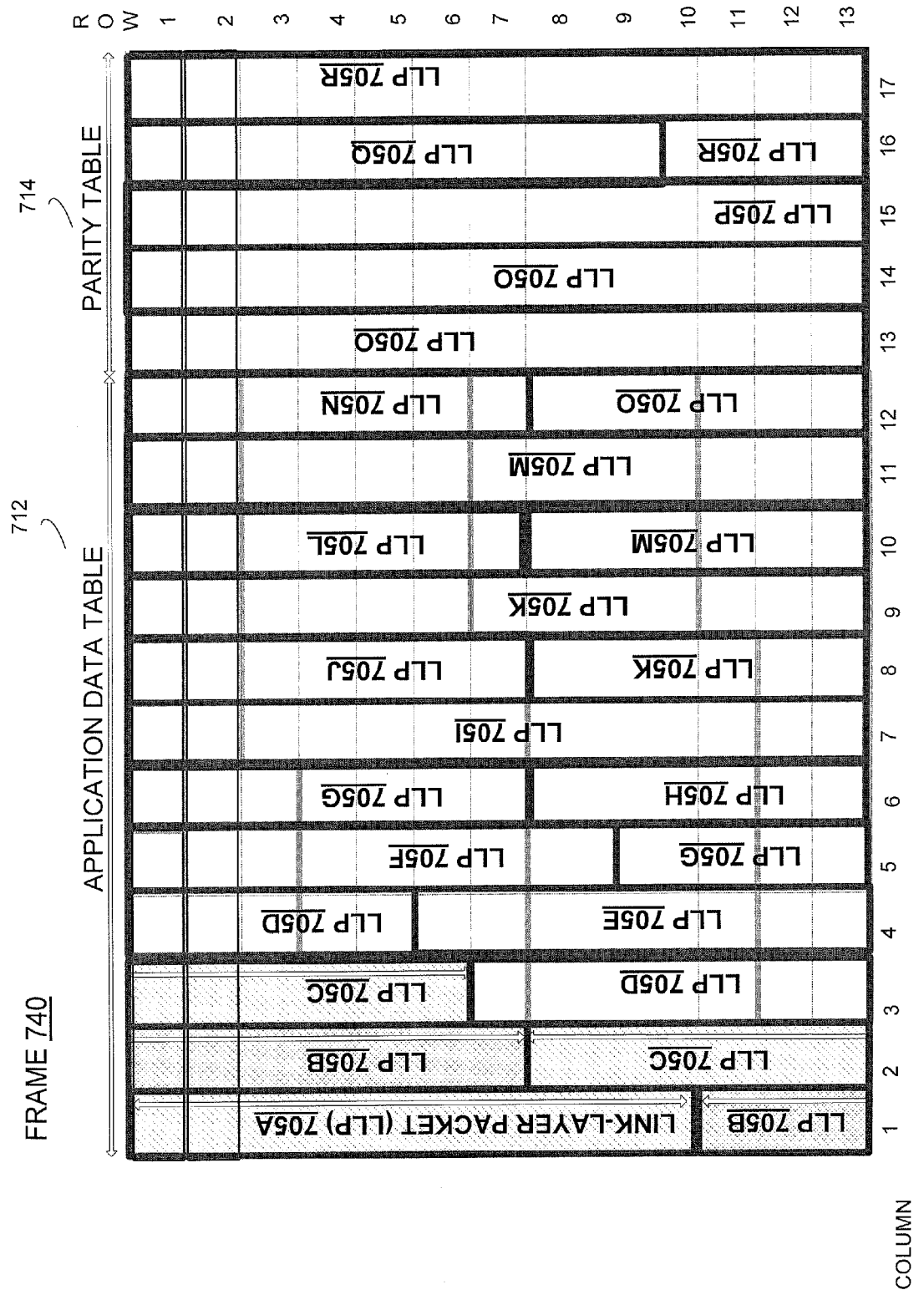
FIGS. 9-11 depict examples of frames at various stages during the process of outer code decoding at the client station.

FIG. 9 depicts an example of frame 740. As link-layer packets 705 are received by deframer 710, the link-layer packets 705 are inserted column-wise. For example, deframer 710 inserts the first link-layer packet (LLP) 705A into the first column, then inserts the second link-layer packet (LLP) 705B after the first link-layer packet, and so forth until the frame has been filled with link-layer packets 705A-R or there are no more link-layer packets for insertion into frame 740.

At 835, when the frame is filled (yes at 830), the outer decoder 725 decodes each of the rows of the frame using the outer code previously selected at base station 110B. For example, when outer coder 220 at base station 110B uses an RS (255,243) forward error-correction code, outer decoder 725 at client station 114A uses the same RS (255,243) forward error-correction code selected at base station 110B to decode each row of frame 740. In some implementations using an inner code, outer decoder 725 decodes the rows even when the inner decoder 720 indicates an error. This is possible because the outer coding scheme described herein distributes application data packets across a greater number of blocks and codewords, so that an error burst is distributed across several packets—making those errors more likely to be detected and/or corrected by the outer decoder 725.

Moreover, the enhanced error-correction may be used to reduce the amount of parity symbols used in frame 240—thus saving bandwidth and providing additional throughput. Moreover, if erasure correction is not used at client station 114A during the outer decoding process 800, additional savings in terms of throughput may be attained.

At 840, when the outer decoder 725 has decoded some of the rows of frame 740, deframer 710 reads, row-wise, each row of frame 740 by reading row-by-row the application data table 712. For example, deframer 710 reads the first row of application data table 712 and continues reading row-by-row to form application data packet(s), which is the same pattern used to insert the application data packets into the frame at 310 (FIG. 3). Although 840 describes an exemplary row-wise reading, other approaches may be used, such as column-wise, block-wise, and the like.

Figure 10:
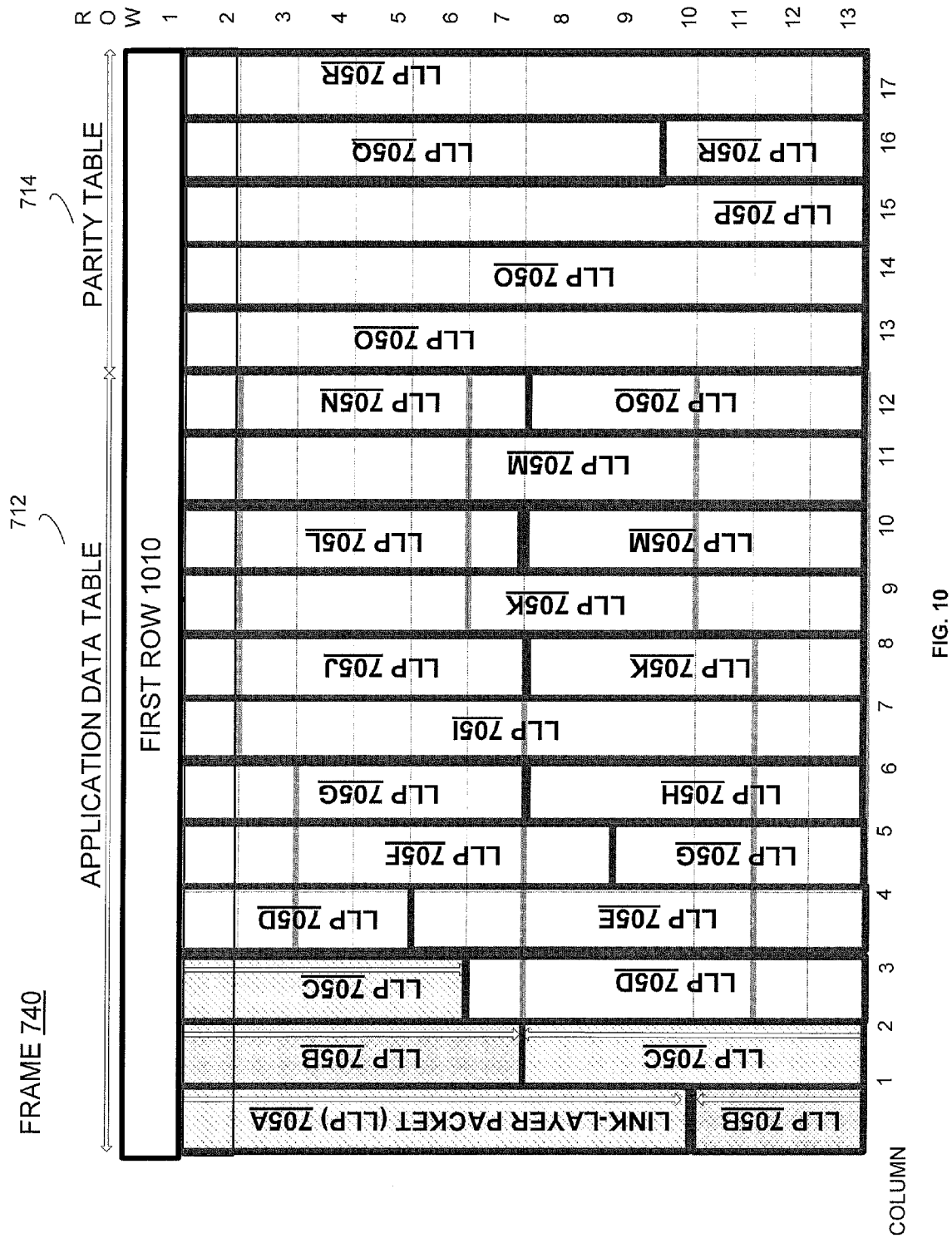

FIG. 10 depicts an example of a row 1010, which will be decoded by outer decoder 725. Although FIG. 10 depicts a single row 1010 selected for decoding, outer decoder 725 typically decodes each of the rows of frame 240.

Figure 11:
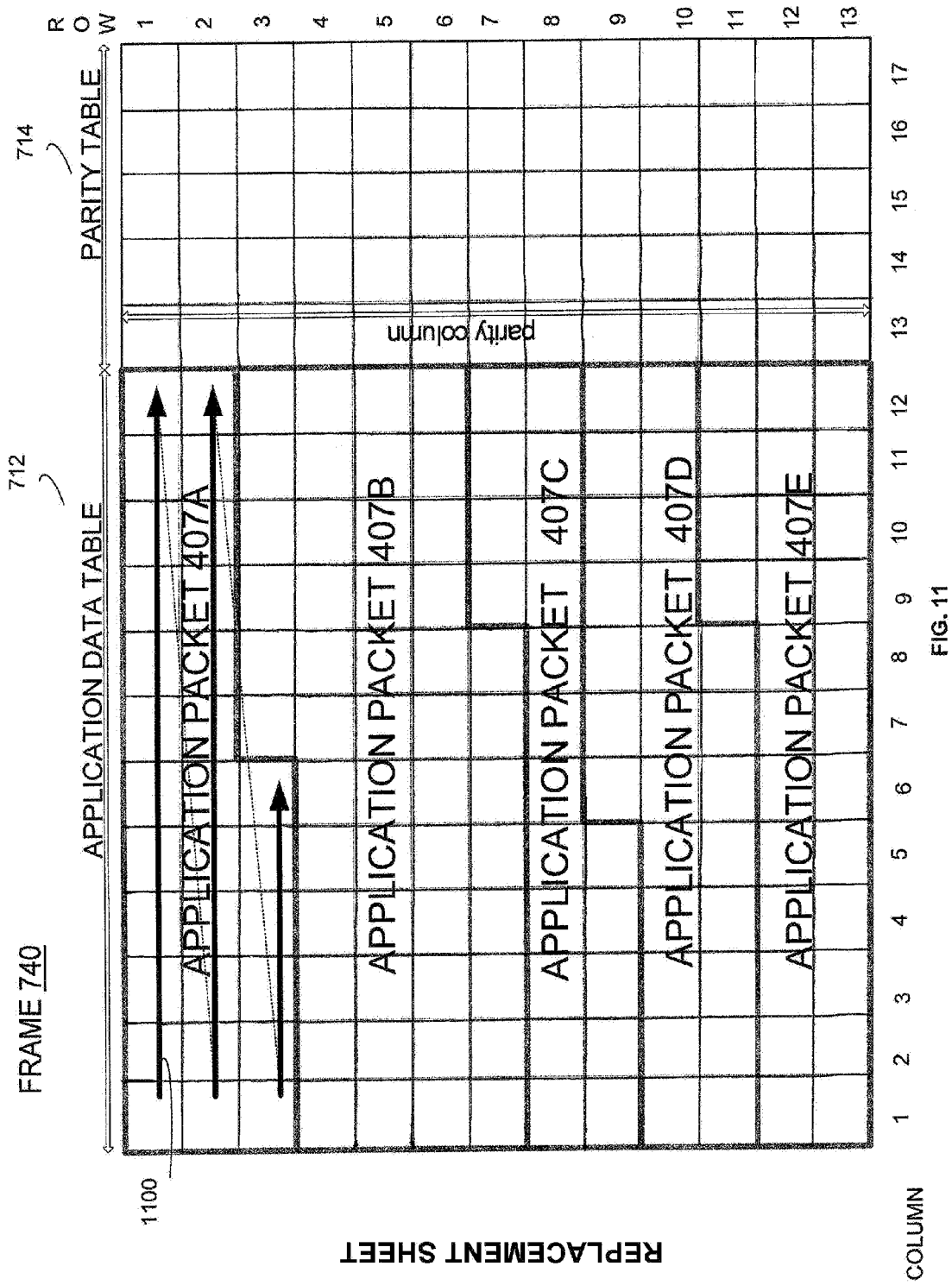

FIG. 11 depicts frame 740 after each row has been decoded by outer decoder 725. The deframer 710 reads frame 740 row-wise. For example, to form the application data packet 407A, deframer 710 reads row-wise the values of the first row, the second row, and a portion of the third row of frame 740. Moreover, although FIG. 11 depicts a row-wise read pattern 1100, other read patterns may be used as well. Furthermore, frame 740 may include packet delimiter information to indicate the start and stop of each of the application data packets 407A-E. Although FIG. 11 depicts a row-by-row reading of frame 740, deframer 710 would read frame 740 consistent with how the application data packets were written into the frame 240 at the base station. For example, when application data packets are written into frame 240 in a column-by-column manner, as described above with respect to FIG. 4B, deframer 710 reads frame 740 in a column-by-column manner. Moreover, when application data packets are written into frame 240 in a block basis, as described above with respect to FIG. 4C, deframer 710 reads frame 740 in a block basis.

At 850, deframer 710 provides the read packet, such as application data packets 407A-E, to another component, such as a higher-layer application at client station 114A. For example, application data packets 407A-E may be associated with an application, such as a digital video broadcast application at client station 114A. When that is the case, the use of outer coding as described above with respect to processes 300 and 800, enables the digital video broadcast to be provided to client station 114A with fewer errors and/or enhanced throughput.

Although the description above describes the inner coder 225, framer 210, and outer coder 220 at a base station, the inner coder 225, framer 210, and outer coder 220 may be implemented at other locations, such as at a client station. Furthermore, although the description above describes the inner decoder 720, deframer 710, and outer decoder 725 at a client station, the inner decoder 720, deframer 710, and outer decoder 725 may be implemented at other locations, such as at a base station.

Figure 12:
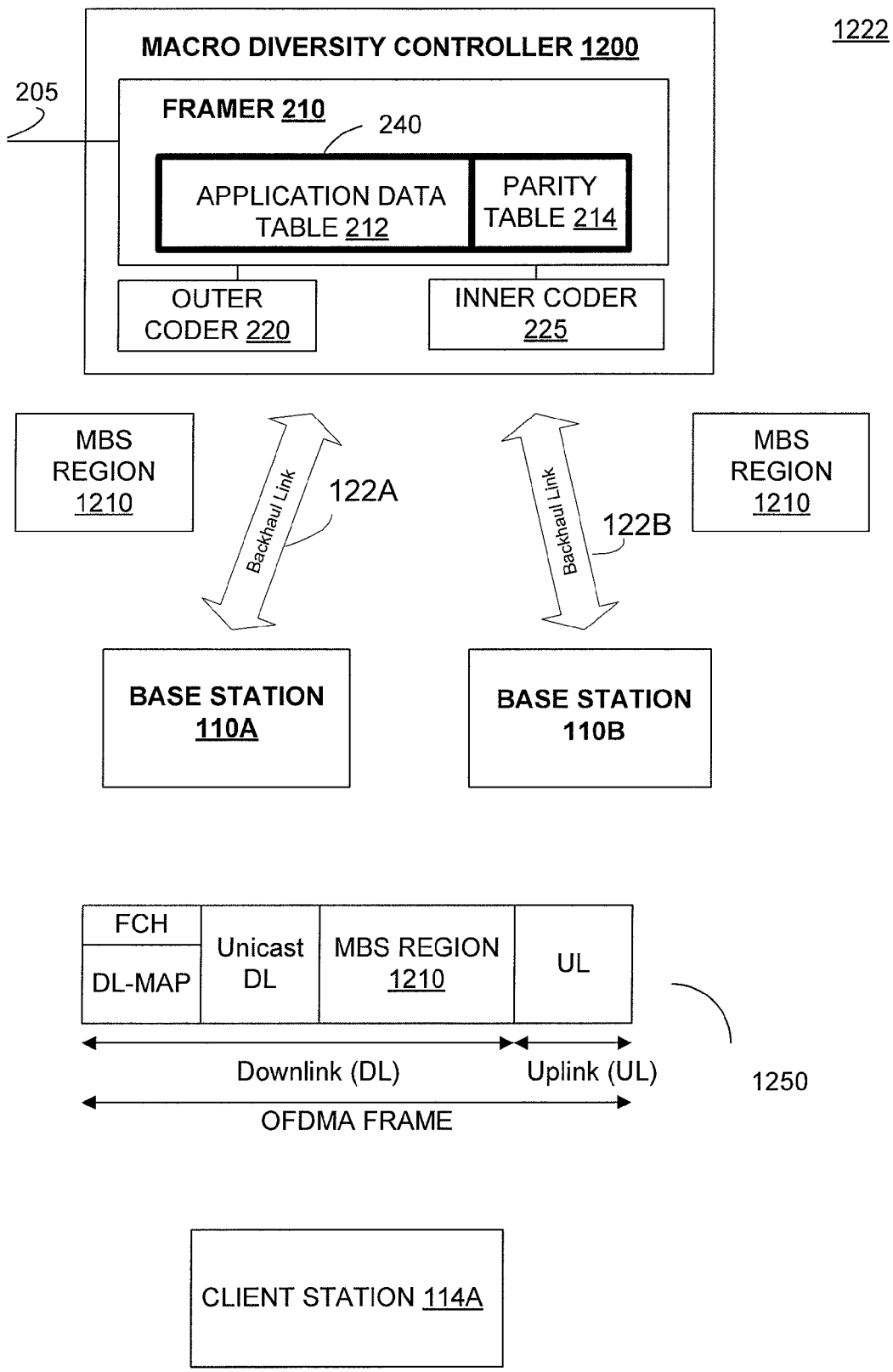
FIG. 12 depicts a block diagram of a controller implementing outer coding.

FIG. 12 depicts an implementation of framer 210, outer coder 220, and inner coder 225 in a macrodiversity controller 1200. The output of the inner coder 225 may be link-layer packets that are used as protocol data units (PDUs), such as HARQ PDUs in conformance with IEEE 802.16. The PDUs are inserted into a macrodiversity region, such as a multicast and broadcast region (MBS) consistent with IEEE 802.16. As used herein, the phrase "macrodiversity region" refers to any type of data region of a data frame usable for broadcast data. The macrodiversity controller 1200 distributes the MBS region 1210 to zero or more base stations 110A and 10B. The macrodiversity controller 1200 also schedules the transmissions of MBS region 1210 at base stations 110A and 110B, such that the base stations synchronously transmit the MBS region over about the same frequency using about the same waveform (e.g., about the same modulation and coding scheme), and using about the same framing parameters (e.g., number of symbols in the OFDMA frame, length of symbol, cyclic prefix, and the like). In the present embodiment, the base stations 110A and 110B each insert the MBS region 1210 into an OFDMA frame 1250. The base stations then transmit the OFDMA frame 1250 to client stations, such as client station 114A. The MBS region 1210 is transmitted using macrodiversity, while other portions of the OFDMA frame 1250 may not use macrodiversity.

At the client station, such as client station 114A, macrodiversity provides a so-called "macrodiversity gain" by combining the synchronous broadcast transmitted by base stations 110A and 110B. For example, base station 110A and base station 110B would each transmit frame 1250 including the frame control header (FCH), downlink map (DL-Map), and unicast downlink (DL) without using macrodiversity. Although the same MBS region is broadcast using macrodiversity from base stations 110A-B, the other data regions, such as the unicast downlink, may be unique to each base station. Base stations 110A and base station 110B each transmit MBS region 1210, at the same frequency and at the same time using the same waveform, framing parameters, and a common waveform—providing at the client station 114A macrodiversity gain with respect to the transmitted MBS region 1210.

Although the example of FIG. 12 refers to two base stations 110A and 110B, there may be additional base stations operating using macrodiversity to transmit MBS regions. Moreover, in the example of FIG. 12, the outer coder 220 would use the same RS code in a particular zone, such as a geographic area, to allow macrodiversity. However, in some implementations, the same system 1222 includes another macrodiversity controller with a different outer code in its outer coder, in which case the system 1222 may provide another zone of macrodiversity using the other outer code. In some implementations, the macrodiversity controller 1200 may receive packets 205 corresponding to streams of multimedia content, such as digital broadcast television and the like, each stream associated with one or more zones. Moreover, although FIG. 12 depicts the macrodiversity controller 1200 as separate from base stations 110A, 110B, and network controller 124, macrodiversity controller 1200 may be incorporated, in whole or in part, into at least one of a base station, a network controller, and the like.

As noted above, in some implementations, the link-layer packets sent from a base station to a client station may be sent with CRC. However, in systems having low bit error rates (e.g., relatively few bit errors over a given interval of time), the link-layer packets are sent without appended CRC as the outer decoder 725 typically corrects some (if not all) of the bit errors in the link-layer packets. For example, rather than send a HARQ protocol data unit (PDU) that includes a header in the front and a cyclic redundancy check (CRC) appended to the end of the data, the link-layer packet can be sent as one of the blocks 605A-C read from frame 240 at FIG. 6. By not appending the CRC, throughput may be enhanced between the base station and the client station. In implementations not appending a CRC, the marking of erasures (which is described further below) may be disabled at the client station. The term erasures refers to marking, as a possible error, a symbol of a link-layer packet that was received in error, such as, for example, in the event of a CRC failure.

Furthermore, in a network, packets may be transmitted such that some of the packets include a CRC and some do not. For example, a base station may have for transmission a stream including two substreams (described further below). The first substream may include more important information, and, as such, it may be desirable to transmit this so-called "more important" substream such that all client stations have a higher likelihood of reception of this substream. To that end, the link-layer packets for this more important substream may be transmitted with an appended CRC. The second substream may, however, include link-layer packets transmitted without appended CRCs. In this example, the second substream without appended CRC may still be received at client stations (e.g., client stations with better receivers will likely receive the second substream, but less robust client stations may have difficulty with correctly receiving the second substream). Moreover, the link-layer packets with CRC may be transmitted in a frame (e.g., a data structure); while the link-layer packets without CRC may be transmitted in another frame.

Moreover, in a multicast system environment, the broadcaster (e.g., macrodiversity controller 1200, base station 110A, 110B, etc.) may dynamically determine whether or not to include a link-layer packet CRC when multi-casting data. The broadcaster may make this determination by, for example, the client stations providing feedback information about the client stations (e.g., capabilities of the client station, channel estimation parameters, received signal strength, and the like) to the broadcaster. If the broadcaster determines that all client stations to which it will multi-cast the data are sufficiently robust (e.g., the client station includes multiple receive antennas), the broadcaster may determine not to include a link-layer packet CRC. If, however, legacy equipment (or other less robust equipment) is to receive the multi-casted data at client stations, the broadcaster may include link-layer packet CRCs.

Figure 13A:
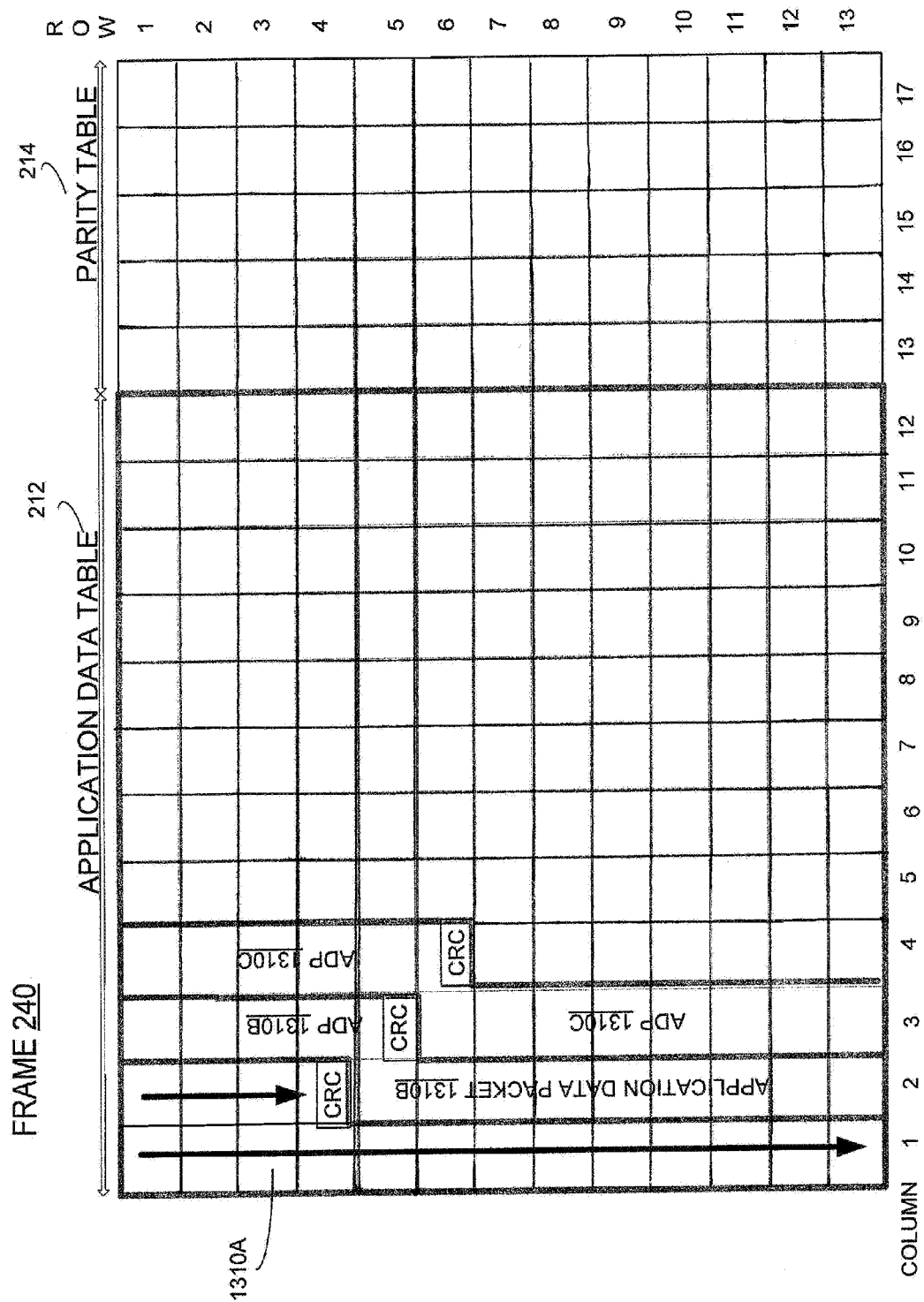
FIGS. 13A-B depict examples of frames with a cyclic redundancy check (CRC) inserted therein.

Moreover, although a CRC may not be appended to link-layer packets, in some implementations, the framer 210 may add a CRC directly to the application data packets inserted into the frame 240. Specifically, FIG. 13A depicts a first application data packet 1310A being inserted into frame 240 in a column-by-column manner and filling the first column and a portion of the second column. FIG. 13A also depicts application data packets 1310B-C and the like inserted across the columns of frame 240. In this implementation, framer 210 inserts a CRC (as depicted at FIG. 13A) at the end of each of the application data packets in the frame 240. Frame 240 of FIG. 13A (including the CRC) would be processed in a similar manner as described above with respect to process 300. For example, frame 240 is encoded using an outer code; the contents of the encoded frame are then used to pack link-layer packets (possibly, without an appended CRC as described above); the link-layer packets are then sent to a client station. Although FIG. 13A illustrates the application data packets 205 being written into frame 240 in a column-by-column basis, the application data packets may be written into frame 240 using other patterns as well (e.g., row-by-row, block-wise, and the like).

At the receiver side, such as client station 114A, the received link-layer packets are processed to recover the transmitted application data packets (e.g., as described above with respect to process 800, with 840 reading the application data packets using the same pattern used to insert those packets into the frame). When the link-layer packets are initially received at a client station, CRC checking is not necessary, if the link-layer packets were not appended with CRC. The frame 240 is then decoded by outer decoder 725 (e.g., each row of frame 240 is decoded using an outer code as described above at 835). Next, the deframer 710 uses the CRC inserted into frame 240 (which is inserted by base station 110B before transmission) to determine whether an application data packet is still useable given that an outer codeword is in error. If the deframer 710 determines that the application packet is not received in error as indicated by the CRC check in the frame, the CRC is then removed and the application data packet may be treated as not received in error, in which case the application data packet is forwarded to another component for use. If the deframer 710 determines that the application packet is received in error as indicated by the CRC check in the frame, the application data packet is discarded (e.g., not used). The above embodiment in which an application packet CRC is appended to the application packet prior to insertion of the application packet in the frame may be, for example, particularly useful in implementations in which the application packet does not include a robust error checking mechanism, such as for example, in implementations in which the application packets are IP (Internet Protocol), UDP (User Datagram Protocol), or RTP (Real-time Transport Protocol) type packets.

Figure 13B:
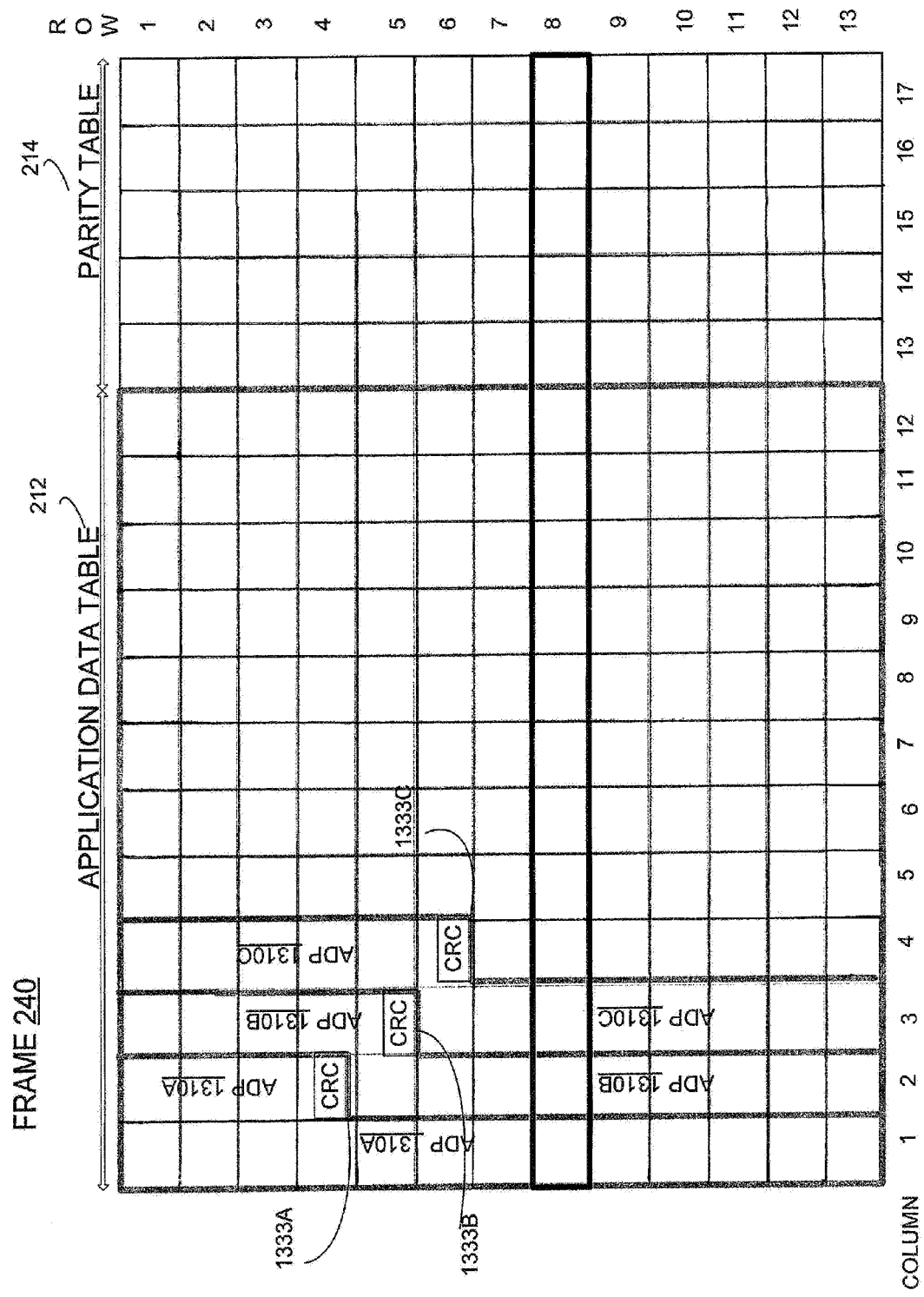

FIG. 13B depicts an example where the outer codeword of row 8 is in error (e.g., which exceeds the error-correction ability of the outer code and thus cannot be corrected). When that is the case, a typical deframer 710 does not use the entire frame 240 since that codeword can affect all the link-layer packets. However, the use of the application packet CRCs 1333A-C enable the deframer 710 to determine which application data packets are still useable. For example, if the CRC 1333A for application data packet 1310A indicates that application data packet 1310A is not in error, deframer 710 sends application data packet 1310A to another component of client station 114A. On the other hand, if the CRC 1333B for application data packet 1310B indicates that application data packet 1310B is in error, deframer 710 may discard application data packet 1310B. The CRCs 1333A-C inserted in frame 240 thus enable a determination of which application data packets in the frame 240 are in error given codeword errors. As such, rather than discard all of the application data packets when there are codeword errors, these frame-based CRCs may enable application data packets to be used even when a codeword error is detected.

Figure 14A:
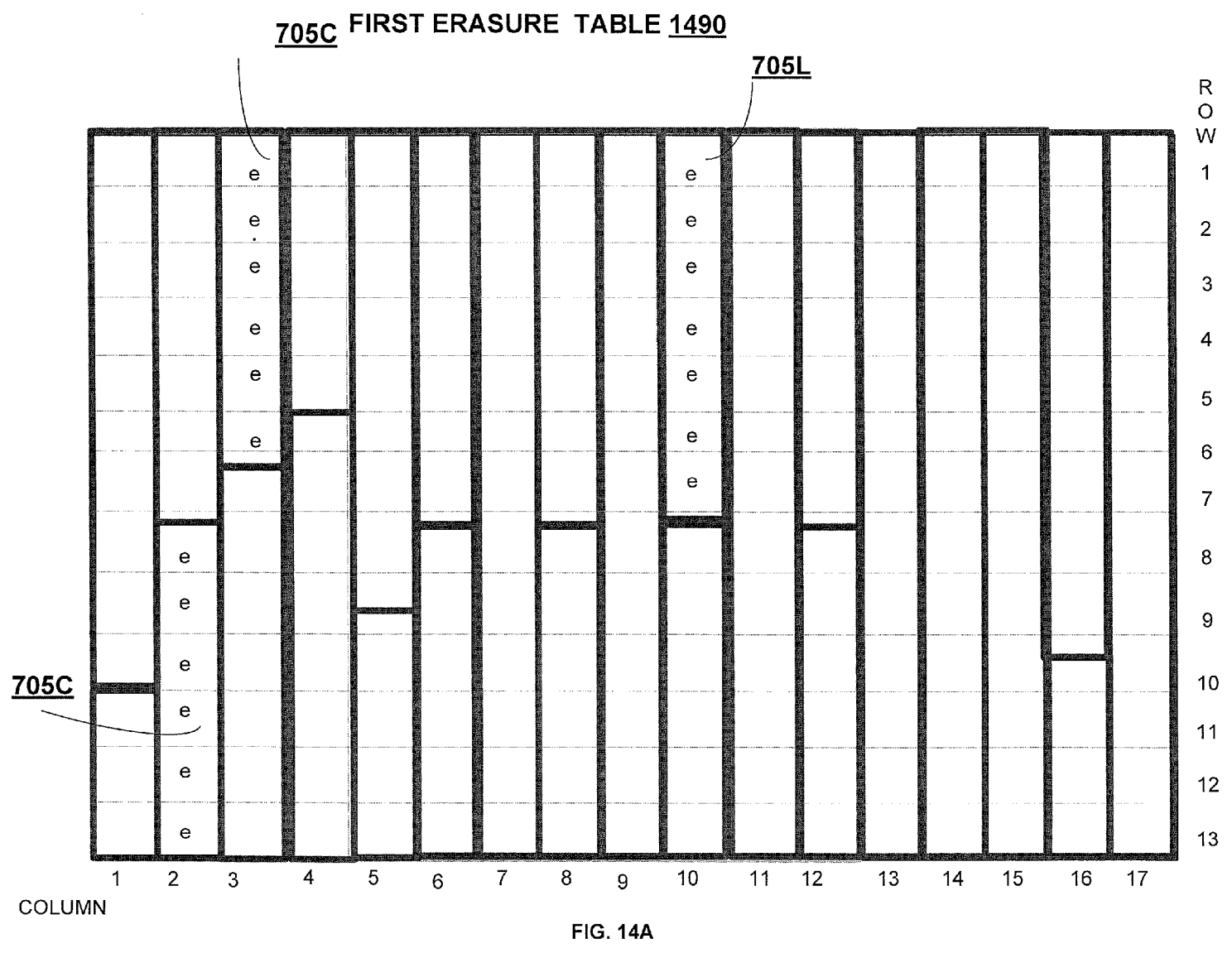

In implementations using a link-layer CRC (e.g., appending, by the base station, a CRC to link-layer packets), client station 114A (and, in particular, at least one of the deframer 710 at FIG. 7 or a CRC error checking module (not shown at FIG. 7)) may include one or more erasure tables. For example, when the link-layer packets are received at client station 114A, the CRC (e.g., a CRC-16) is used to identify whether each of the received link-layer packets were correctly received. If the CRC indicates no error, deframer 710 inserts the link-layer packets into a frame, such as frame 240 depicted at FIG. 9. If the CRC indicates that one or more of the link-layer packet have an error, the deframer 710 marks the one or more link-layer packets as erroneous. This marking of a link-layer packet as erroneous is done using an erasure table, which typically has, for example, the same structure as frame 240 depicted at FIG. 9. FIG. 14A depicts an example of an erasure table marking erasures (e.g., with a value "e") at link-layer packets 705C and 705L.

Figure 14B:
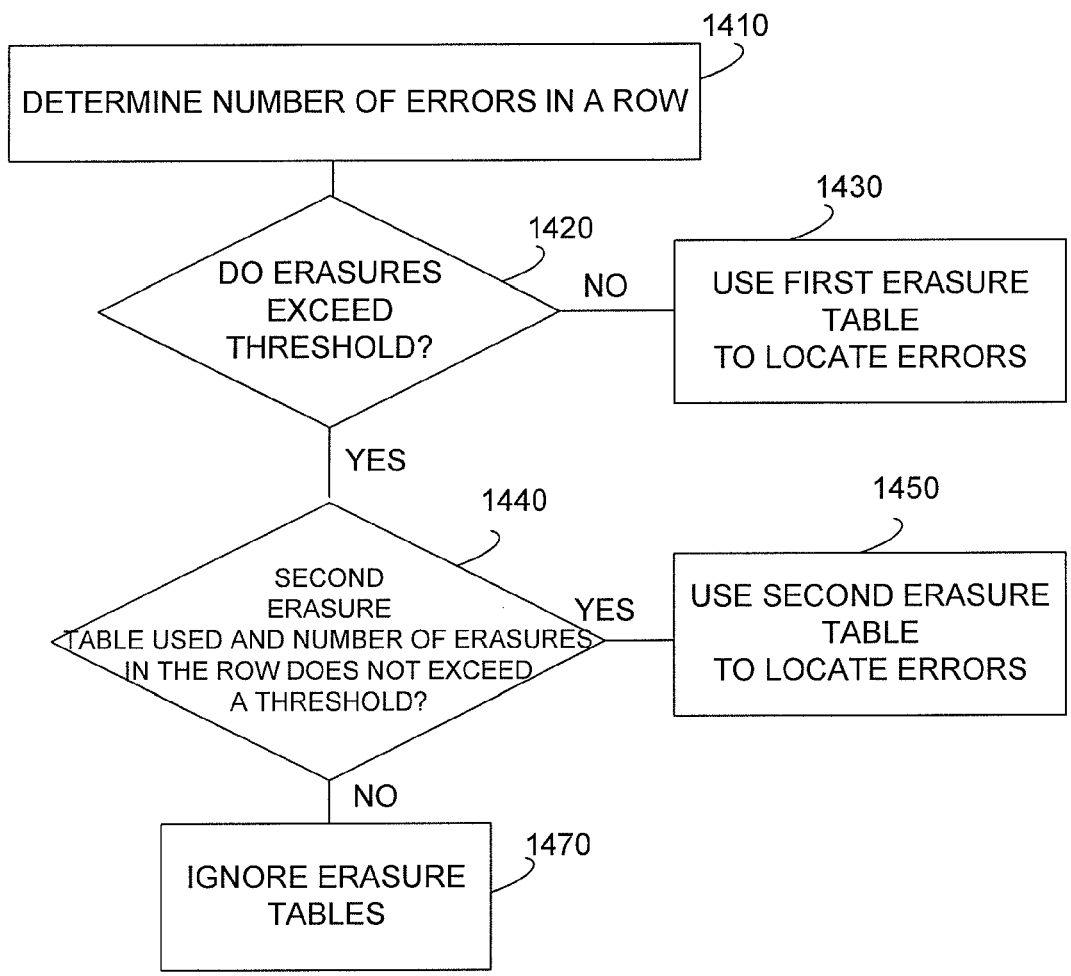
FIG. 14B depicts a process for using one or more erasure tables.

FIG. 14B depicts a process 1400 for using one or more erasure tables.

At 1410, deframer 710 determines the number of errors in, for example, each of the rows of frame 740. For example, when the received link-layer packet includes an appended CRC (e.g., a HARQ PDU), erasures are marked in an erasure table, such as first erasure table 1490 in FIG. 14A. In the example depicted at FIG. 14A, link-layer packets 705C and 705L are marked as erasures. Referring to FIG. 14A, each of rows 1-6 includes two erasures, while each of rows 7-13 include 1 erasure.

If the number of erasures exceeds a threshold, the outer codeword will not be correctable at the client station using the outer code. The threshold may be determined based on the following equation:

(2.times.number of errors)+number of erasures.1-toreq.p, wherein p represents the amount of parity (e.g., number of parity symbols, such as bytes) used by the outer code, number of errors represents the number of errors in the codeword that are not indicated as erasures, and number of erasures represents the number of symbols in the codeword that are indicated to be erasures. In the example of FIGS. 9 and 14A, the amount of parity corresponds to 5 symbols. As such, in any given row (e.g., a row of a frame coded as a code block by outer coder 220), the outer decoder 725 (or other like error-correction mechanism) can correct at most 5 erasures (which leaves zero (0) symbol errors to be corrected by the 5 parity symbols). In this example, the erasures do not exceed the threshold of 5. Thus, deframer 710 uses, at 1430, a first erasure table 1495 to locate and correct erasures. For example, deframer 710 provides the erasure table 1490 to outer decoder 725 (or other like error-correction mechanism) to enable location and correction of the marked erasures. If the number of erasures exceeds the threshold (yes at 1420), a second erasure table may be used (yes at 1440). FIG. 14C depicts an example of a second erasure table 1495. The second erasure table 1495 may have a similar structure as erasure table 1490. However, the second erasure table 1495 marks erasures based on another aspect in addition to the CRC used to mark the erasures of first erasure table 1490. For example, the second erasure table 1495 may use the client station's measurement of the instantaneous received RF signal carrying link-layer packets 705A-R, as depicted at FIG. 9. In addition to instantaneous received RF signal, other factors may be taken into account. For example, if there was a receive failure and no data was received, a corresponding erasure will be marked in the erasure table. Furthermore, in combination with SINR, MCS, inner codeword code rate, and FEC block size may also be factored into the decision whether (or not) to mark an erasure in the second erasure table.

In some implementations, the instantaneous signal to interference-plus-noise ratio (SINR) may be used to mark the erasures (labeled "e") at FIG. 14C. It should be noted that SINR is but one example of information that may be used for determining whether to mark the symbols as erasures or not. For example, client station 114A may measure the instantaneous SINR of the RF signal carrying the received link-layer packets. The instantaneous SINR can provide an indication of what fraction of the symbols are in error. If the fraction is large, erasure marking should be used. If the fraction is small, it might be better to not mark erasures. As such, the deframer may use the actual, received symbols for link-layer packets in the frame, during which time the SINR was high even though there was a CRC failure (which would otherwise result in discarding the received symbols forming the link-layer packets). Deframer 710 may provide the second erasure table 1495 to outer decoder 725 to enable location and correction of the marked erasures. In some implementations, additional erasure tables (e.g., a third, a forth, and the like) may be used to mark erasures based on aspects other than instantaneous SINR. Moreover, one or more of the erasure tables may be used to determine whether a packet is likely to have a large fraction of the symbols in error. In some implementations, the second erasure table is not implemented. Moreover, if the use of the second erasure table is not successful (e.g., the codeword turned out to be uncorrectable when using any of the erasure information sets corresponding to the row), the deframer may ignore the all erasure tables when decoding the codeword (as describe with respect to 1470).

If the number of erasures does exceed a threshold (yes at 1420) and a second erasure table is not used (no at 1440), deframer 710 may ignore the erasures in the first and second erasure tables 1490 and 1495. When that is the case, the deframer 710 provides the frame 240 (e.g., the packets depicted at FIG. 9) to outer decoder 725, so that the outer decoder 725 can decode, for example, the rows of the frame 240. The output of outer decoder 725 represents application data packets, which can be provided to another component of client station 114A. The decisions of method 1400 may be made on a row-by-row basis. For example, one row may use the first erasure table (step 1430) in decoding, another row may use the second erasure table (step 1450), and another row may ignore the erasure tables (step 1470). Moreover, if error correction is not successful using one of the sets of erasure information, the client station may attempt to repeat decoding more than once using a new set of erasure information, or no erasure table information. Each such attempt may increase the overall probability of successful error correction.

In some implementations, the amount of parity is varied from time diversity interval to time diversity interval (TDI) to maintain an overall error rate over the time diversity intervals. As used herein, the phrase "time diversity interval" refers to a time interval during which a group of consecutive OFDMA frames are transmitted. For example, the amount of data for transmission may vary from time diversity interval to time diversity interval.

Figure 15:
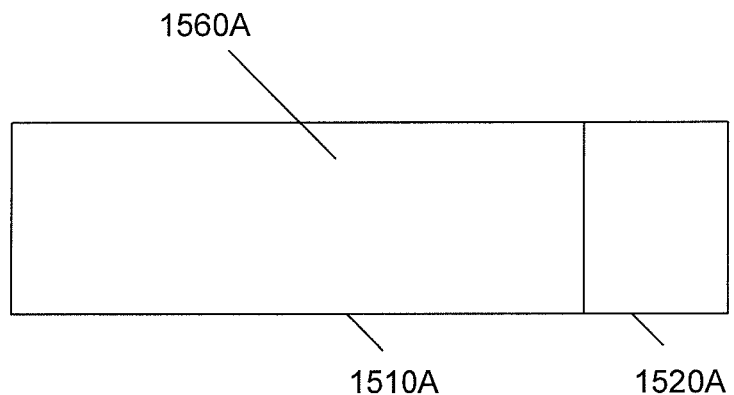
FIG. 15 depicts varying the parity symbols.
Figure 15:
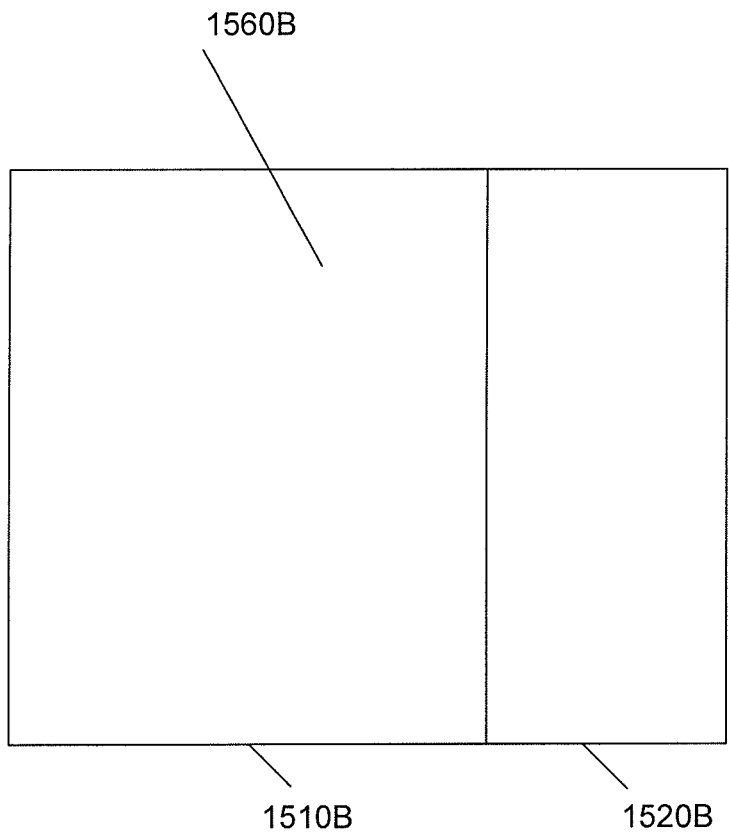

FIG. 15 depicts frames 1560A-B including application data tables 1510A-B and parity tables 1520A-B in two different TDIs. For example, a framer, such as framer 210 at FIG. 2, receives B bytes (wherein B represents a quantity of bytes) of application data for transmission and inserts the B bytes into the application data table 1510A portion of frame 1560A. In this example, the overall width of the frame 1560A is set to a fixed number of columns (e.g., bytes, symbols, etc.). Accordingly, increasing the throughput during a time diversity interval comprises adding rows to the frame 1560A. With this approach, a frame 1560A is deemed in error if any codeword in the frame 1560A is decoded in error. That is, a frame 1560A is deemed in error if any row is received in error after decoding. Further, in this embodiment, it is desired to have a TDI error rate that is generally constant from TDI to TDI. This may be achieved by having a frame 1560A error that is generally constant from TDI to TDI. In other words, a consistent error rate is maintained in a time diversity interval by adjusting the amount of parity used in each outer coding block. For example, if the incoming data rate is high, a larger outer coding block size may be used when compared to when the data rate is low. To that end, the likelihood of a particular outer coding block being received in error is maintained at a substantially consistent amount by adjusting the amount of parity based on the size of the outer code block. For example, to achieve the same outer code block error rate, a large outer code block is implemented using more parity than a small outer code block.

In the example of FIG. 15, it is assumed that the system is to transmit B bytes of data during a first TDI, and then in a second TDI the data rate has increased and the system is to transmit B*10 bytes of data. It is further assumed that the frame 1560A has a fixed width (e.g., a width of 255 bytes) and the number of rows may vary from frame 1560A to frame 1560B. The width of 255 bytes is exemplary only and in other implementations, other widths may be used.

An outer coder, such as outer coder 220 implemented as an RS coder, may insert B bytes of data into the application data table 1510A portion of frame 1560A during the first TDI, wherein B represents a quantity of bytes. During the second TDI, however, the data rate has increased and the outer coder inserts ten times B bytes (i.e., B.times.10) into the application data table 1510B portion of frame 1560B. Thus, in this example, the frame 1560B in the second TDI uses more rows than the frame 1560A in the first TDI given the fixed, overall column width. As noted above, in the present embodiment it is desired for the frame error rate to be generally constant across the TDIs. Thus, because the frame 1560B has more rows, the risk of frame 1560B being in error (i.e., a row is received in error) is greater than the risk of frame 1560A being in error if the same amount of parity is used for a given row in both frames. Accordingly, to achieve a generally constant TDI error rate, the amount of parity is allowed to vary in frames 1560A-B transmitted during different TDIs. In the present embodiment, the amount of parity may be a function of the amount of data to be transmitted during the TDI. For example, in the embodiment of FIG. 15, frame 1560A may use X parity bytes per row in parity Table 1520A, while frame 1560B may use more parity bytes per row in parity Table 1520B, for the TDI error rate to remain generally constant. In other words, given a metric of maintaining a fairly constant correctable error rate from frame to frame, the amount of parity can be reduced when the amount of received data decreases (or increased when the amount of received data increases, such as when the data rate increase). As such, the amount of parity is varied from interval to interval to maintain an error rate over the intervals.

Referring again to FIG. 12, the MBS regions may carry content from a service. A service may provide a stream of packets corresponding to content, such as a video stream of packets consistent with, for example, H.264 (i.e., International Telecommunications Union, H.264: Advanced video coding for generic audiovisual services video stream of packets, November 2007). The stream may be inserted into the data regions, such as MBS regions, for transmission by one or more base stations to one or more client stations. Moreover, the transmission of the MBS regions may use macrodiversity, as noted above. Furthermore, the transmission may be in a zone, such as a geographic area. To illustrate using a broadcast television analogy, the zone may be the area of San Diego, and the streams may each correspond to a channel of content available in San Diego. As such, a user at a client station may change streams (e.g., channels) to change service content at the client station.

A stream may include one or more substreams. The term "substream" refers to a portion of the stream that is treated differently than other substreams of the stream. For example, a stream of H.264 video may be divided into two substreams, so that one substream includes important content requiring more error correction and/or more robust modulation than the other substream.

In some implementations, one of the substreams is designated to carry information considered more important when compared to other substreams. Returning to the H.264 example, parameter information associated with the H.264 video may be considered more important and thus encoded using a more robust coding and modulation scheme, while other information associated with other substreams is considered less important (which can be carried using less robust modulation and coding schemes). In particular, the more important substream may be implemented using one or more of the following: appending CRC on the link-layer packets, using one or more erasure tables, not adapting the amount of parity to maintain a correctable error metric from frame-to-frame, and using a more robust modulation and coding scheme (e.g., 16-ary QAM and rate ½ encoding), when compared to the less important substreams. On the other hand, the less important substream traffic may be implemented using one or more of the following: omitting CRC on the link-layer packets, using zero erasure tables, using the above-described frame-based CRC to protect the application data packets (e.g., when CRC is not appended to link-layer packets), adapting the amount of parity to maintain a correctable error metric from frame-to-frame and using a less robust modulation and coding scheme (e.g., 64-ary QAM and rate ½ encoding), when compared to the more important substream.

In some implementations, such as the one described above, the more important substream is more likely to be received by a client station, such as a client station considered to have a high bit error rate (e.g., as a result of having lower-quality, high bit error rate equipment, being at the fringe of a sector, and the like), but this improved likelihood of reception comes at the price of lower overall throughput. On the other hand, although the less important substream is somewhat less likely to be received by a high bit error rate client station, the transmission of the less important substream is more efficient in terms of throughput. Regardless of the type of substream, a low bit error rate client station (e.g., a client station having low bit error rate equipment, being close to a base station, and the like) is more likely to receive both the important substream and the less important substream(s) and also benefit from the throughput efficiencies implemented with the less important substreams.

The subject matter described herein may be embodied in systems, apparatus, methods, and/or articles depending on the desired configuration. In particular, various implementations of the subject matter described, such as the components of base station 110B described with respect to FIG. 2, the components of client station 114A as described with respect to FIG. 7, as well as the macrodiversity controller 1200, may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components of base station 110B, client station 114A, macrodiversity controller 1200 and aspects of processes 300 and 800 may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Moreover, although the above describes the rows as horizontal portions of the frame and the columns as vertical portions of the frame, in some embodiments, the rows are arranged as a vertical portion of the frame and, as such, the columns would be arranged as a horizontal portion of the frame. Moreover, although the above describes writing to a frame row-wise and then reading from that frame column-wise, the rows and columns of the frame can be swapped (e.g., by rotating the frame by 90 degrees), in which case the above noted processes and systems continue to be operative (e.g., at 320, packets are inserted column-wise and read at 335 row-wise). Other embodiments may be within the scope of the following claims.

What is claimed is:

1. A method comprising:
   determining, based on a cyclic redundancy check, a first erasure table including zero or more erasures;
   determining a second erasure table, wherein the first and second erasure tables are associated with the same data;
   using the first erasure table to locate errors in a frame of packets, when the zero or more erasures of the first erasure table do not exceed a threshold of erasures; and
   using the second erasure table to locate errors in the frame of packets, when the zero or more erasures of the first erasure table do exceed the threshold of erasures.

2. The method of claim 1, wherein determining the second erasure table further comprises:

using at least one of a receive failure and a signal-to-noise ratio to determine the second erasure table, wherein the frame comprises a Reed-Solomon table.

3. The method of claim 1 further comprising:
counting erasures in at least one codeword in at least one of the first erasure table and the second erasure table; and
decoding the frame of packets, when additional information is included in at least one of the first erasure table and the second erasure table.

4. The method of claim 1, wherein the second erasure table is not used to locate errors in a codeword in the frame of packets when the second erasure table comprises a plurality of erasures in the codeword exceeding a second threshold; the method further comprising:
decoding the codeword in the frame of packets without using erasure information when the threshold and the second threshold are exceeded.

5. The method of claim 1, further comprising:
decoding at least one codeword in the frame of packets using the second erasure table to provide a decoded codeword;
determining whether the decoded codeword is in error; and
decoding the codeword in the frame of packets without using erasure information based on the determining whether the decoded codeword is in error.

6. The method of claim 1 further comprising:
receiving packets appended with a cyclic redundancy check, the cyclic redundancy check used to determine erasures for the first erasure table;
inserting the received packets into one or more columns of the frame;
decoding, using an outer code, one or more rows of the frame; and
reading a portion of the frame, when the one or more rows are decoded using the outer code, the portion inserted into an application data table.

7. A method comprising:
receiving application data packets, each appended with a cyclic redundancy check, the application data packets included in a frame and decoded, at a client station, using an outer code;
reading, from the frame, at least one application data packet; and
discarding, at least one of the read application data packets, when the cyclic redundancy check appended to the at least one read application data packet indicates an error.

8. The method of claim 7 further comprising:
inserting link-layer packets into the frame, the frame configured as a Reed-Solomon table, the link-layer packets received, at the client station, without an appended cyclic redundancy check (CRC).

9. The method of claim 7, wherein discarding further comprises:
discarding by not providing the application data packet in error to another component at the client station.

10. The method of claim 7, wherein discarding further comprises:
using, at least one of the read application data packets, when the cyclic redundancy check appended to the at least one read application data packet indicates the at least one read application data packet is not in error.

11. A method comprising:
inserting link-layer packets into a frame, the frame configured to include a data portion and a parity portion, the parity portion configured to substantially maintain a quantity of frame errors; and
decoding, using an outer code, the frame, when one or more columns of the frame have been filled; and reading, from the frame, application data packets.

12. The method of claim 11, wherein the frame error is an error in a codeword of the frame, and wherein the frame is configured to have a fixed quantity of columns.

13. The method of claim 11 further comprising:
maintaining the quantity of frame errors by varying, in another frame, a fraction of columns of the corresponding parity portion.

14. The method of claim 11 further comprising:
maintaining the quantity of frame errors by increasing, in another frame, a fraction of columns of the corresponding parity portion.

15. The method of claim 11, wherein the frame is in a first time interval and the other frame is in a second time interval.

* * * * *